(12) United States Patent
Kuramoto et al.

(10) Patent No.: US 10,950,770 B2
(45) Date of Patent: Mar. 16, 2021

(54) METHOD FOR PRODUCING AN ELECTRONIC DEVICE

(71) Applicant: NICHIA CORPORATION, Anan (JP)

(72) Inventors: Masafumi Kuramoto, Anan (JP); Satoru Ogawa, Anan (JP); Katsuaki Suganuma, Suita (JP); Keun-Soo Kim, Suita (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/451,559

(22) Filed: Jun. 25, 2019

(65) Prior Publication Data

US 2019/0326493 A1 Oct. 24, 2019

Related U.S. Application Data

(60) Continuation of application No. 15/708,848, filed on Sep. 19, 2017, now Pat. No. 10,573,795, which is a (Continued)

(30) Foreign Application Priority Data

Jan. 17, 2008 (JP) .............................. JP2008-007583

(51) Int. Cl.
*H01B 1/02* (2006.01)
*H01L 33/62* (2010.01)
(Continued)

(52) U.S. Cl.
CPC ............ *H01L 33/62* (2013.01); *B23K 1/0008* (2013.01); *B23K 1/0016* (2013.01); (Continued)

(58) Field of Classification Search
CPC .................................. H05K 1/095; H01B 1/02
(Continued)

(56) References Cited

U.S. PATENT DOCUMENTS 5,360,673 A   11/1994   Mayer et al.
5,882,722 A   3/1999    Kydd
(Continued)

FOREIGN PATENT DOCUMENTS

CN   1022934   12/1993
CN   1195308   3/2005
(Continued)

OTHER PUBLICATIONS

CN Office Action dated Nov. 5, 2012, issued in corresponding CN Application No. 200980102372.2.
(Continued)

*Primary Examiner* — Khanh T Nguyen
(74) *Attorney, Agent, or Firm* — Birch, Stewart, Kolasch & Birch, LLP

(57) ABSTRACT

An object of the present invention is to provide a method for producing a conductive material that allows a low electric resistance to be generated, and that is obtained by using an inexpensive and stable conductive material composition containing no adhesive. The conductive material can be provided by a producing method that includes the step of sintering a first conductive material composition that contains silver particles having an average particle diameter (median diameter) of 0.1 μm to 15 μm, and a metal oxide, so as to obtain a conductive material. The conductive material can be provided also by a method that includes the step of sintering a second conductive material composition that contains silver particles having an average particle diameter (median diameter) of 0.1 μm to 15 μm in an atmosphere of oxygen or ozone, or ambient atmosphere, at a temperature in a range of 150° C. to 320° C., so as to obtain a conductive material.

15 Claims, 1 Drawing Sheet

Related U.S. Application Data continuation of application No. 14/608,064, filed on Jan. 28, 2015, now Pat. No. 9,812,624, which is a division of application No. 12/596,339, filed as application No. PCT/JP2009/050212 on Jan. 9, 2009, now Pat. No. 8,968,608.

(51) Int. Cl.
   *B23K 1/00* (2006.01)
   *B23K 35/02* (2006.01)
   *H05K 1/09* (2006.01)

(52) U.S. Cl.
   CPC ............ *B23K 35/025* (2013.01); *H01B 1/02* (2013.01); *H01L 2924/0002* (2013.01); *H01L 2933/0066* (2013.01); *H05K 1/092* (2013.01); *Y10T 29/49144* (2015.01)

(58) Field of Classification Search
   USPC .......................................... 252/514; 174/257
   See application file for complete search history.

(56) References Cited

U.S. PATENT DOCUMENTS

| | | |
|---|---|---|
| 7,081,214 B2 | 7/2006 | Matsuba et al. |
| 7,154,743 B2 | 12/2006 | Takatani et al. |
| 7,276,185 B2 | 10/2007 | Totokawa et al. |
| 7,766,218 B2 | 8/2010 | Yamakawa et al. |
| 7,771,627 B2 | 8/2010 | Takahashi et al. |
| 2001/0050370 A1 | 12/2001 | Sakamoto et al. |
| 2001/0052600 A1 | 12/2001 | Sakamoto et al. |
| 2003/0020159 A1 | 1/2003 | Schwarzbauer |
| 2004/0004209 A1 | 1/2004 | Matsuba et al. |
| 2004/0127626 A1 | 7/2004 | Yoshiko et al. |
| 2004/0169020 A1 | 9/2004 | Yamauchi |
| 2004/0191501 A1 | 9/2004 | Rasiah |
| 2004/0214418 A1 | 10/2004 | Noda et al. |
| 2004/0248998 A1 | 12/2004 | Honda et al. |
| 2005/0116203 A1 | 6/2005 | Takahashi et al. |
| 2005/0194577 A1* | 9/2005 | Kasuga ................. H05K 1/095 252/514 |
| 2006/0065901 A1 | 3/2006 | Aoyagi et al. |
| 2006/0114645 A1 | 6/2006 | Takatani et al. |
| 2007/0074391 A1 | 4/2007 | Totokawa et al. |
| 2007/0079665 A1 | 4/2007 | Sasaki et al. |
| 2007/0094872 A1 | 5/2007 | Konishi et al. |
| 2007/0098883 A1 | 5/2007 | Itoh et al. |
| 2007/0212564 A1 | 9/2007 | Sasaki et al. |
| 2008/0138238 A1 | 6/2008 | Sasaki et al. |
| 2008/0160183 A1 | 7/2008 | Ide et al. |
| 2008/0169122 A1 | 7/2008 | Shiraishi et al. |
| 2009/0025967 A1 | 1/2009 | Boureghda et al. |
| 2009/0162557 A1 | 6/2009 | Lu et al. |
| 2009/0230172 A1 | 9/2009 | Ogashiwa et al. |
| 2010/0186992 A1 | 7/2010 | Ogawa et al. |
| 2012/0045573 A1 | 2/2012 | Sato et al. |

FOREIGN PATENT DOCUMENTS

| | | |
|---|---|---|
| EP | 0367562 A2 | 5/1990 |
| EP | 1 801 891 A1 | 6/2007 |
| EP | 1 950 767 B1 | 7/2008 |
| JP | 61-148883 A | 7/1986 |
| JP | H02-238054 A | 9/1990 |
| JP | 6-4790 A | 1/1994 |
| JP | 6-13756 A | 1/1994 |
| JP | 6-61602 A | 3/1994 |
| JP | 6-302213 A | 10/1994 |
| JP | 7-11364 A | 1/1995 |
| JP | 8-148512 A | 6/1996 |
| JP | 10-88206 A | 4/1998 |
| JP | H1088206 A1 | 4/1998 |
| JP | 10-284516 A | 10/1998 |
| JP | 10-308120 A | 11/1998 |
| JP | 11-111052 A | 4/1999 |
| JP | 2001-15817 A | 1/2001 |
| JP | 2001-049086 A | 2/2001 |
| JP | 2001-49309 A | 2/2001 |
| JP | 2001-131499 A | 5/2001 |
| JP | 2001-216839 A | 8/2001 |
| JP | 2001-325831 A | 11/2001 |
| JP | 2002-64225 A | 2/2002 |
| JP | 2002-368285 A | 12/2002 |
| JP | 2003-8071 A | 1/2003 |
| JP | 2003-8161 A | 1/2003 |
| JP | 2003-55701 A | 2/2003 |
| JP | 2003-525974 A | 9/2003 |
| JP | 2003-303999 A | 10/2003 |
| JP | 2003-309352 A | 10/2003 |
| JP | 2004-58466 A | 2/2004 |
| JP | 2004-128330 A | 4/2004 |
| JP | 2004-143325 A | 5/2004 |
| JP | 2004-172160 A | 6/2004 |
| JP | 2004-217978 A | 8/2004 |
| JP | 2004-253251 A | 9/2004 |
| JP | 2004-277688 A | 10/2004 |
| JP | 2004-319454 A | 11/2004 |
| JP | 2004-335920 A | 11/2004 |
| JP | 2004-362950 A | 12/2004 |
| JP | 2005-48236 A | 2/2005 |
| JP | 2005-48237 A | 2/2005 |
| JP | 2005-93380 A | 4/2005 |
| JP | 2005-509293 A | 4/2005 |
| JP | 2005-126726 A | 5/2005 |
| JP | 2005-129303 A | 5/2005 |
| JP | 2005-136224 A | 5/2005 |
| JP | 2005-200604 A | 7/2005 |
| JP | 2005-267900 A | 9/2005 |
| JP | 2005-298661 A | 10/2005 |
| JP | 2005-3310820 A | 11/2005 |
| JP | 2006-24808 A | 1/2006 |
| JP | 2006-32511 A | 2/2006 |
| JP | 2006-49147 A | 2/2006 |
| JP | 2006-66519 A | 3/2006 |
| JP | 2006-100500 A | 4/2006 |
| JP | 2006-135267 A | 5/2006 |
| JP | 2006-147457 A | 6/2006 |
| JP | 2006-237141 A | 9/2006 |
| JP | 2007-19106 A | 1/2007 |
| JP | 2007-42301 A | 2/2007 |
| JP | 2007-53212 A | 3/2007 |
| JP | 2007-180059 A | 7/2007 |
| JP | 2007-184153 A | 7/2007 |
| JP | 2007-207604 A | 8/2007 |
| JP | 2007-214162 A | 8/2007 |
| JP | 2007-234299 A | 9/2007 |
| JP | 2007-527102 A | 9/2007 |
| JP | 2007-258647 A | 10/2007 |
| JP | 2007-294355 A | 11/2007 |
| JP | 2007-302953 A | 11/2007 |
| JP | 2007-324523 A | 12/2007 |
| JP | 2008-166086 | 7/2008 |
| JP | 2008-208442 A | 9/2008 |
| JP | 5212364 B2 | 6/2013 |
| TW | 591095 B | 6/2004 |
| TW | I251018 B | 3/2006 |
| TW | I286997 B | 9/2007 |
| TW | I322995 B | 4/2010 |
| TW | I347614 B | 8/2011 |
| WO | WO 03/041165 A2 | 5/2003 |
| WO | WO 2004/055843 A1 | 7/2004 |
| WO | WO 2005/079353 A2 | 9/2005 |
| WO | WO 2005079353 A1 | 9/2005 |
| WO | WO 2006/095611 A1 | 9/2006 |
| WO | WO 2006/126614 A1 | 11/2006 |
| WO | WO 2007/034833 A1 | 3/2007 |

OTHER PUBLICATIONS

Extended European Search Report, dated Feb. 4, 2014, for European Application No. 09702097.8.

(56) References Cited

OTHER PUBLICATIONS

Japanese Information Offer Form dated Apr. 27, 2011 for Japanese Application No. 2009-13711.
JP Office Action dated Jun. 5, 2012, issued in corresponding JP Application No. 2009-512355.
Ohashi, "High-Tech Bunko (book collection) (1) Q & A Diffusion Bonding", published by Sanpo Publications Inc., dated Jun. 10, 1993, p. 35.
Osawa, "Science and Application of Soldering", published by Kogyo Chosakai Publishing Co., Ltd., dated Jun. 25, 2000, pp. 320-321.
Suganuma, "Wiring Technology of Metallic Nano Particle Ink—Ink-jet Technology," CMC Publishing Co., Ltd., Tokyo, Japan, First edition published: Mar. 31, 2006, Popular edition published: Jun. 8, 2011, 46 pages, including a partial English translation.
Takausu, "New Technology for Kneading and Dispersing Conductive Filler and Measures for Troubles thereof," Kurashiki Printing Co., Ltd.; First edition published: Sep. 29, 2004, 45 pages; including a partial English translation.
Tatsumi, et al., Development of Metal-to-Metal Bonding Process via In-situ Formation of Ag Nanoparticies Using $Ag_2O$ Microparticles, Graduate School of Engineering, Osaka University, Hitachi, Ltd. Materials Research Laboratory, Oct. 28, 2008, pp. 1 and 2; with English language translation.
U.S. Advisory Action issued in U.S. Appl. No. 12/596,339 dated Apr. 18, 2013.
U.S. Advisory Action issued in U.S. Appl. No. 12/596,339 dated Mar. 11, 2014.
U.S. Notice of Allowance issued in U.S. Appl. No. 12/596,339 dated Oct. 24, 2014.
U.S. Office Action dated May 13, 2011 for U.S. Appl. No. 12/691,999.
U.S. Office Action issued in U.S. Appl. No. 12/596,339 dated Dec. 3, 2013.
U.S. Office Action issued in U.S. Appl. No. 12/596,339 dated Dec. 7, 2012.
U.S. Office Action issued in U.S. Appl. No. 12/596,339 dated Jul. 11, 2013.
U.S. Office Action issued in U.S. Appl. No. 12/596,339 dated Jun. 6, 2012.
U.S. Office Action issued in U.S. Appl. No. 12/596,339 dated May 19, 2014.
Yi Li, C.P. Wong, "Recent advances of conductive adhesives as a lead-free alternative in electronic packaging: Materials, processing, reliability and applications", Materials Science and Engineering R vol. 51, 2006, pp. 1-35.
"'New' Kneading/Dispersion Technology of Conductive Filler and Countermeasures against Defects." Technical Information Association, Sep. 29, 2004, pp. 1-20.
"Conductive adhesive technology that has reached this point", Industrial Research Association, Jan. 20, 2004, pp. 1-15.
"New Metal Data Book", published Feb. 1, 1984, Homat Ad-Publishing Division, pp. 1-8.
"Practical Non-Ferrous Small Encyclopedia," Revised 5th Edition, published by Sangyo Shimbun, pp. 1-10.
"Science and Chemistry Dictionary", Third Edition, Supplement, Issue 5, Iwanami Shoten Co., LTD., Feb. 15, 1985, pp. 1-5.
Fukuda Metal Foil & Powder Industry Co., Ltd., "Product Information flake silver powder Silcoat AgC." <https://www.fukuda-kyoto.co.jp/product/detail/7>>, downloaded Feb. 9, 2019.
Offer of Information, dated Apr. 2, 2019 from JPO in corresponding Japanese Patent Application No. 2009-512355.
Offers of Information (2), dated Mar. 19, 2019 from JPO in corresponding Japanese Patent Application No. 2009-512355.
Appeal Decision issued Apr. 9, 2018 in corresponding Japanese Application No. 2009-512355.
Offer of Information, sent Jun. 11, 2019 from JPO in corresponding Japanese Patent Application No. 2009-512355.
Offer of Information, sent Jun. 18, 2019 from JPO in corresponding Japanese Patent Application No. 2009-512355.
Offer of Information, sent Jun. 20, 2019 from JPO in corresponding Japanese Patent Application No. 2009-512355.
Offer of Information, sent Jun. 4, 2019 from JPO in corresponding Japanese Patent Application No. 2009-512355.
Progress Information of Trial Information of Japanese Patent No. 5212364 (Offer of Information sent Jun. 18, 2019 from JPO in Japanese Patent Application No. 2009-512355).

* cited by examiner

METHOD FOR PRODUCING AN ELECTRONIC DEVICE

CROSS REFERENCE TO RELATED APPLICATIONS

This application is a Continuation of U.S. application Ser. No. 15/708,848, filed on Sep. 19, 2017, which is a Continuation of U.S. application Ser. No. 14/608,064, filed on Jan. 28, 2015 (now U.S. Pat. No. 9,812,624, issued on Nov. 7, 2017), which is a Divisional under 35 U.S.C. § 120 of U.S. application Ser. No. 12/596,339, filed on Oct. 16, 2009 (now U.S. Pat. No. 8,968,608, issued on Mar. 3, 2015), which is the National Stage Entry of PCT/JP2009/050212 filed on Jan. 9, 2009; and this application claims priority under 35 U.S.C. § 119 of Application No. 2008-007583 filed in Japan on Jan. 17, 2008. The entire contents of all these applications are hereby incorporated by reference.

TECHNICAL FIELD

The present invention relates to a method for producing a conductive material, a conductive material obtained by the method, an electronic device containing the conductive material, a light-emitting device, and a method for producing a light-emitting device.

BACKGROUND ART

Conventionally, a method for producing copper wiring by applying a copper foil over a substrate and etching the same has been used predominantly. However, this producing method, using etching, has a problem that a large amount of liquids and materials are wasted.

Then, the following method for producing a wiring board has been known as a method that does not use etching: a paste-form conductive composition containing metal (e.g. silver, copper, etc.) particles having a particle diameter of a micron order and an adhesive (e.g. epoxy-based adhesive, acrylic adhesive, silicone-based adhesive, etc.) is applied over a substrate, and is heated at 150° C. to 180° C. (see, for example, Non-Patent Document 1). By this producing method, distances between metal particles in the conductive paste are decreased when the adhesive is heated and hardened, and consequently the metal particles become dense and allow current to pass therethrough, whereby wiring is produced. With this producing method, however, an electric resistance obtained is about $5\times10^{-5}$ Ωcm, which is relatively high for practical application, and therefore, a lower electric resistance has been demanded.

Another method has been known also, in which a paste-form conductive composition obtained by dispersing microparticles of a silver compound such as silver oxide in a reducing organic solvent is applied over a substrate, and is heated at the vicinity of 200° C., whereby wiring is produced (see, for example, Patent Document 1). By this producing method, microparticles of a silver compound such as silver oxide in the paste change to silver particles when the composition is heated at the vicinity of 200° C., and consequently the silver particles are connected and allow current to pass therethrough, whereby wiring is produced. However, this producing method has the following problems: since this method involves a quantitative reduction reaction of the microparticles of the silver compound such as silver oxide, an intense reaction with the reducing organic solvent occurs, and owing to a large amount of gas generated, such as a gas generated by the decomposition of the reducing organic solvent and oxygen gas generated by the reduction of the silver compound, irregular voids are formed in the conductive composition, which become stress concentration points that make the conductive composition easily destroyed and dangerous upon handling. A method modified in such a manner that silver particles of a micron order are mixed in the composition in order to solve these problems has been known also, but this merely provides a slight improvement, though the degree may vary, since the producing method is based on, as the principle, the metal connection caused by the reduction of microparticles of a silver compound such as silver oxide.

Further, a conductive composition containing silver oxide microparticles and a reducing agent that reduces the same has been known (see, for example, Patent Document 2). This conductive composition also has a problem in that a high-temperature reaction heat is generated, which causes a gas to be generated, as in the above-described case.

A granular silver compound with an organic compound having 1 to 8 carbon atoms being adhered to surfaces of particles has been known (see, for example, Patent Document 3). When this silver compound is heated, the organic compound on the surfaces act as a reducing agent, and as a result, the granular silver compound can be reduced to silver. However, this granular silver compound also has a problem in that a high-temperature reaction heat is generated, which causes a gas to be generated, as in the above-described case.

A conductive paste composed of silver, silver oxide, and an organic compound having a property of reducing silver oxide has been known (see, for example, Patent Document 4). This conductive paste also has a problem in that a high-temperature reaction heat is generated, which causes a gas to be generated, as in the above-described case.

A method for producing a conductive material has been known, in which a porous conductive material having a voidage of 20% to 60% and having a content of an organic substance of 20% or less with respect to the mass thereof, which is obtained by heating a composition composed of silver oxide (I) $Ag_2O$ so as to change the silver oxide into silver, is subjected to plating additionally (see, for example, Patent Document 5).

Another method also has been known, in which a paste-form conductive composition containing a low crystallized silver filler having a particle diameter of a micron order and silver nanoparticles is applied over a substrate, and is heated at the vicinity of 200° C., whereby wiring is produced (see, for example, Patent Document 6). By this producing method, when the foregoing composition is heated at the vicinity of 200° C., the silver nanoparticles are molten or sintered, and fused so as to adhere to one another, and allow current to pass therethrough, whereby wiring is produced. In this producing method, however, there is a problem that the silver nanoparticles cost high.

In the case of the above-described producing methods, it is necessary to use an adhesive that makes it difficult to decrease an electric resistance, to use microparticles of a silver compound as a principal material, such as silver oxide being unstable and having a strong reducing tendency, or to use a conductive composition containing expensive silver nanoparticles.

In the case that such a material of a conventional technique is applied to electronic components as a bonding material for device electrodes, die attaches, and microbumps, this material applied, for example, in a light-emitting device is used for mounting light-emitting elements on a substrate such as a lead frame or a printed circuit board. Light-emitting elements in recent years have a problem in that an adhesive discolors owing to heat generated by the application of high current, and an electric resistance varies with time as an organic component of a resin or the like is degraded by heat and light. Particularly in the case of the method in which the bonding completely depends on the adhesion power of the adhesive, it is concerned that there might occur the following critical problem: when an electronic component is mounted by soldering, the bonding material may lose an adhesion power under the solder melting temperature, and separation occurs, which results in failure of lighting.

Patent Document 1: JP 2003-309352A
Patent Document 2: JP 2004-253251 A
Patent Document 3: JP 2005-200604 A
Patent Document 4: JP 2005-267900 A
Patent Document 5: JP 2006-24808 A
Patent Document 6: 2005-129303 A
Non-Patent Document 1: Yi Li, C. P. Wong, "Recent advances of conductive adhesives as a lead-free alternative in electronic packaging: Materials, processing, reliability and applications", Materials Science and Engineering, 2006, R 51, pp. 1-35.

DISCLOSURE OF INVENTION

Problem to be Solved by the Invention

It is an object of the present invention to provide a method for producing a conductive material that allows a low electric resistance to be generated, and that is obtained by using an inexpensive and stable conductive material composition containing no adhesive.

Means for Solving Problem

It has been known conventionally that silver nanoparticles fuse at a low temperature, but it has not been known that silver particles of a micron order fuse at a low temperature. The inventors of the present invention found that silver particles of a micron order fuse when they are heated at a low temperature under oxidizing conditions such as the presence of an oxide or oxygen, and completed the present invention based on the foregoing finding.

The present invention is a method for producing a conductive material, including the step of sintering a first conductive material composition that contains silver particles having an average particle diameter (median diameter) of 0.1 µm to 15 µm, and a metal oxide, so as to obtain a conductive material. Hereinafter, in the present specification, this producing method is referred to as a first method for producing a conductive material.

The present invention is a method for producing a conductive material, including the step of sintering a second conductive material composition that contains silver particles having an average particle diameter (median diameter) of 0.1 µm to 15 µm in an atmosphere of oxygen or ozone, or ambient atmosphere, at a temperature in a range of 150° C. to 320° C., so as to obtain a conductive material. Hereinafter, in the present specification, this producing method is referred to as a second method for producing a conductive material.

Effects of the Invention

The producing methods of the present invention have an advantage in that a conductive material that allows a low electric resistance to be generated can be produced. Further, the producing method of the present invention has an advantage in that a conductive material can be produced with use of an inexpensive and stable conductive material composition containing no adhesive.

DESCRIPTION OF THE INVENTION

Figure 1:
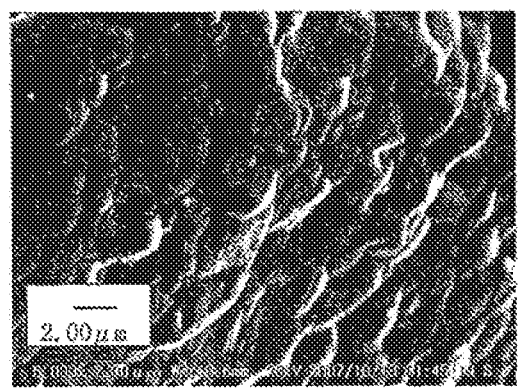
FIG. 1 is an electron micrograph showing a conductive composition obtained in Example 2.

The inventors of the present invention found the following. When a composition containing silver particles having an average particle diameter of 0.1 µm to 15 µm was sintered in the presence of a metal oxide or in an atmosphere of oxygen or ozone, or ambient atmosphere, as an oxidizer, the silver particles fused, for example, even at a temperature in the vicinity of 150° C., whereby a conductive material was obtained. On the other hand, in nitrogen atmosphere, when a composition containing silver particles having an average particle diameter of 0.1 µm to 15 µm was sintered, a conductive material was not obtained at a low temperature in the vicinity of 150° C. Based on this finding, the inventors of the present invention completed the present invention, i.e., a method for producing a conductive material which includes the step of sintering a composition that contains silver particles having an average particle diameter of 0.1 µm to 15 µm, in the presence of a metal oxide, or in an atmosphere of oxygen or ozone, or ambient atmosphere, as an oxidizer.

The conventional method for producing a conductive material, which uses microparticles of a silver compound such as silver oxide and a reducing organic solvent, has a problem in that a high-temperature reaction heat is generated, whereby gas is generated, as described above. On the other hand, the method for producing a conductive material according to the present invention makes it possible to produce a conductive material without the problem of a gas generated by decomposition caused by heat of abrupt reaction.

In the method of the present invention for producing a conductive material, the mechanism of the formation of a conductive material is not clear, but can be presumed as follows. When a composition containing silver particles having an average particle diameter of 0.1 µm to 15 µm is sintered in an atmosphere of oxygen or ozone, or ambient atmosphere as an oxidizer, the silver particles partially are oxidized, and silver oxide thus formed by the oxidation, at portions in contact with the silver particles, catalytically exchanges oxygen with the silver particles, so as to repeatedly undergo oxidation-reduction reactions. Through such a step, the conductive material is formed. When a composition containing silver particles having an average particle diameter of 0.1 µm to 15 µm is sintered in the presence of a metal oxide as an oxidizer, the following can be presumed: the metal oxide already contained in the composition, at portions in contact with the silver particles, catalytically exchanges oxygen with the silver particles, so as to repeatedly undergo oxidation-reduction reactions. Through this step, the conductive material is formed. Since the conductive material is produced by the mechanism thus presumed, the method of the present invention for producing a conductive material does not need the use of a conductive material composition containing an adhesive, and hence, allows a conductive material that generates a low electric resistance to be obtained using an inexpensive and stable conductive material composition.

As described above, the present invention is a first method for producing a conductive material, including the step of sintering a first conductive material composition that contains silver particles having an average particle diameter (median diameter) of 0.1 μm to 15 μm, and a metal oxide, so as to obtain a conductive material. With this first producing method, a conductive material having a low resistance can be provided. Further, with the first producing method, since silver particles of a micron order that do not need a special processing can be fused as-is, a conductive material can be produced easily. Still further, with the first producing method, a conductive material can be produced using easily-available and inexpensive silver particles. Still further, the first producing method has an advantage in the following: it is unnecessary to use an adhesive, microparticles of an unstable silver compound, etc., as raw materials. Still further, the first producing method has an advantage in the following: since only portions at which the silver particles are in contact with one another are fused by sintering, voids occur, whereby a film-form conductive material having considerable flexibility can be formed.

As described above, the present invention is a second method for producing a conductive material, including the step of sintering a second conductive material composition that contains silver particles having an average particle diameter (median diameter) of 0.1 μm to 15 μm in an atmosphere of oxygen or ozone, or ambient atmosphere at a temperature in a range of 150° C. to 320° C., so as to obtain a conductive material. With this second producing method, a conductive material having a low resistance can be provided. Further, with the second producing method, since silver particles of a micron order that do not need a special processing can be fused as-is, a conductive material can be produced easily. Still further, with the second producing method, a conductive material can be obtained, with an amount of generated heat being reduced. Still further, with the second producing method, a conductive material can be produced using easily-available and inexpensive silver particles. Still further, the second producing method has an advantage in the following: it is unnecessary to use an adhesive, microparticles of an unstable silver compound, etc. as raw materials. Still further, the second producing method has an advantage in the following: since only portions at which the silver particles are in contact with one another are fused by sintering, voids occur, whereby a film-form conductive material having considerable flexibility can be formed.

In the first method for producing a conductive material, the first conductive material composition preferably further contains either an organic solvent having a boiling point of 300° C. or lower, or water. This is because in the first method for producing a conductive material according to the present invention, the organic solvent or water improves the conformability between the silver particles, thereby promoting the reaction between the silver particles and the metal oxide. In the first method for producing a conductive material, since the silver particles can be contained in the organic solvent or water at a high concentration, without the workability being impaired, the material has smaller shrinkage in volume after sintered. Therefore, it is easy to estimate dimensions of the conductive material to be obtained. Still further, the organic solvent preferably contains either a lower alcohol having one or more substituents selected from the group consisting of lower alkoxy, amino, and halogen, or a lower alcohol other than the same. Such an organic solvent is preferred since it has high volatility, and therefore, residues of the organic solvent in the conductive material obtained after the first conductive material composition is sintered can be reduced.

In the first method for producing a conductive material, the sintering step preferably is carried out in an atmosphere of oxygen or ozone, or ambient atmosphere.

In the first method for producing a conductive material, the sintering step preferably is carried out at a temperature in a range of 150° C. to 320° C.

In the first method for producing a conductive material, the metal oxide preferably is one or more selected from the group consisting of AgO, $Ag_2O$, and $Ag_2O_3$.

In the first method for producing a conductive material, a content of the metal oxide in the first conductive material composition is 5 percent by weight (wt %) to 40 wt % with respect to the silver particles.

In the first method for producing a conductive material, the metal oxide preferably has an average particle diameter (median diameter) of 0.1 μm to 15 μm.

Further, the present invention is a conductive material obtained by the first or second method for producing a conductive material according to the present invention, wherein the silver particles are fused to one another, and a voidage is 5 percent by volume (vol %) to 35 vol %. The conductive material has an advantage of a high bonding strength.

The conductive material of the present invention preferably has a content of silver of 70 wt % or more. Further, the conductive material of the present invention preferably has an electric resistance of $5.0 \times 10^{-5}$ Ω·cm or less.

An electronic device of the present invention is an electronic device containing the conductive material obtained by the first or second method for producing a conductive material according to the present invention, wherein the conductive material is used as a material for electric wiring, component electrodes, die attaches, or microbumps.

A light-emitting device of the present invention is a light-emitting device containing the conductive material obtained by the first method for producing a conductive material according to the present invention, wherein the conductive material is used as a bonding material for bonding a light-emitting element to a wiring board or a lead frame. Hereinafter, in the present specification, this light-emitting device is referred to as a first light-emitting device.

A light-emitting device of the present invention is a light-emitting device containing the conductive material obtained by the second method for producing a conductive material according to the present invention, wherein the conductive material is used as a bonding material for bonding a light-emitting element to a wiring board or a lead frame. Hereinafter, in the present specification, this light-emitting device is referred to as a second light-emitting device.

A light-emitting device of the present invention is a light-emitting device containing a conductive material, the conductive material being obtained by heating a conductive paste containing silver particles having an average particle diameter (median diameter) of 0.1 μm to 15 μm and alcohol at 150° C. to 300° C., wherein the conductive material is used as a bonding material for bonding a light-emitting element to a wiring board or a lead frame. Hereinafter, in the present specification, this light-emitting device is referred to as a third light-emitting device.

In the third light-emitting device of the present invention, the alcohol preferably is either a lower alcohol, or a lower alcohol having one or more substituents selected from the group consisting of lower alkoxy, amino, and halogen.

In the first, second, and third light-emitting devices of the present invention, the wiring board preferably includes at least one selected from the group consisting of a ceramic substrate containing aluminum oxide, aluminum nitride, zirconium oxide, zirconium nitride, titanium oxide, titanium nitride, or a mixture of any of these; a metal substrate containing Cu, Fe, Ni, Cr, Al, Ag, Au, Ti, or an alloy of any of these; a glass epoxy substrate; and a BT resin substrate.

In the first, second, and third light-emitting devices of the present invention, the lead frame preferably includes a metal member containing Cu, Fe, Ni, Cr, Al, Ag, Au, Ti, or an alloy of any of these.

In the first, second, and third light-emitting devices of the present invention, the wiring board or the lead frame preferably is covered further with Ag, Au, Pt, Sn, Cu, Rh, or an alloy of any of these.

Further, a method for producing the first light-emitting device according to the present invention includes the steps of: applying a first conductive material composition that contains silver particles having an average particle diameter (median diameter) of 0.1 µm to 15 µm, and a metal oxide, over the wiring board or the lead frame; placing the light-emitting element on the first conductive material composition, so as to obtain a light-emitting device precursor; and sintering the light-emitting device precursor, so as to obtain a light-emitting device.

Still further, a method for producing the second light-emitting device according to the present invention includes the steps of: applying a second conductive material composition that contains silver particles having an average particle diameter (median diameter) of 0.1 µm to 15 µm over the wiring board or the lead frame; placing the light-emitting element on the second conductive material composition, so as to obtain a light-emitting device precursor; and sintering the light-emitting device precursor in an atmosphere of oxygen or ozone, or ambient atmosphere, at 150° C. to 320° C., so as to obtain a light-emitting device.

Still further, a method for producing the third light-emitting device according to the present invention includes the steps of applying a conductive paste that contains silver particles having an average particle diameter (median diameter) of 0.1 µm to 15 µm and alcohol over the wiring board or the lead frame; placing the light-emitting element on the conductive paste, so as to obtain a light-emitting device precursor; and sintering the light-emitting device precursor at 150° C. to 300° C., so as to obtain a light-emitting device.

As the silver particles in the present invention, regarding the type as to the average particle diameter (median diameter), silver particles of one type may be used, or alternatively, silver particles of two or more types may be mixed and used. In the case where the silver particles is of one type, the average particle diameter (median diameter) is 0.1 µm to 15 µm, preferably 0.1 µm to 10 µm, and more preferably 0.3 µm to 5 µm. In the case where the silver particles of two or more types are mixed, for example, average particle diameters (median diameters) of the two types are 0.1 µm to 15 µm and 0.1 µm to 15 µm in combination, preferably 0.1 µm to 15 µm and 0.1 µm to 10 µm in combination, and more preferably 0.1 µm to 15 µm and 0.3 µm to 5 µm in combination. In the case where the silver particles of two or more types are mixed, the content of the silver particles of the type having an average particle diameter (median diameter) of 0.1 µm to 15 µm is, for example, 70 wt % or more, preferably 80 wt % or more, and more preferably 90 wt % or more. With this, the electric resistance can be decreased.

The average particle diameter (median diameter) of silver particles in the present invention can be measured by a laser method. It should be noted that the "average particle diameter (median diameter)" means a value where an accumulated frequency by volume is 50%, which is derived from a particle diameter distribution.

The silver particles in the present invention have a specific surface of 0.5 m$^2$/g to 3 m$^2$/g, preferably 0.6 m$^2$/g to 2.5 m$^2$/g, and more preferably 0.6 m$^2$/g to 2 m$^2$/g. With this, an area where adjacent silver particles are in contact with each other can be increased. The specific surface of a silver particle as a principal material of the conductive material composition of the present invention can be measured by a BET method.

Though the shape of a silver particle in the present invention is not limited, examples of the shape include a spherical shape, a flat shape, and a polyhedral shape. The shapes of the silver particles having an average particle diameter (median diameter) in a certain range are uniform preferably. In the case where silver particles of two or more types with different average particle diameters (median diameters) that are mixed together are used as the silver particles in the present invention, the respective types regarding the average particle diameters (median diameters) may have the same shape or different shapes. For example, when silver particles of two types having an average particle diameter (median diameter) of 3 µm and an average particle diameter (median diameter) of 0.3 µm are mixed, the silver particles having an average particle diameter (median diameter) of 0.3 µm may have a spherical shape each, while the silver particles having an average particle diameter (median diameter) of 3 µm may have a flat shape each.

Examples of the metal oxide in the first conductive material composition of the present invention include silver oxides (e.g. AgO, $Ag_2O$, and $Ag_2O_3$); chlorites (e.g. potassium chlorite, sodium chlorite, and copper chlorite); chlorates; chlorates (e.g. potassium chlorate, barium chlorate, calcium chlorate, sodium chlorate, and ammonium chlorate); perchlorates (e.g. potassium perchlorate, sodium perchlorate, and ammonium perchlorate); bromates (e.g. potassium bromate, sodium bromate, and magnesium bromate); iodates (e.g. potassium iodate, sodium iodate, and ammonium iodate); inorganic peroxides (e.g. potassium peroxide, sodium peroxide, calcium peroxide, magnesium peroxide, barium peroxide, and lithium peroxide); nitrates (e.g. potassium nitrate, sodium nitrate, ammonium nitrate, uranyl nitrate, calcium nitrate, silver nitrate, iron (II) nitrate, iron (III) nitrate, copper (II) nitrate, lead (II) nitrate, and barium nitrate); permanganic acid; permanganates (e.g. potassium permanganate, ammonium permanganate, sodium permanganate, zinc permanganate, magnesium permanganate, calcium permanganate, and barium permanganate); dichromates (e.g. ammonium dichromate, and potassium dichromate); periodates (e.g. sodium periodate); periodic acid (e.g. metaperiodic acid); chromium oxides (e.g. chromium trioxide); lead oxides (e.g. lead dioxide); iodine oxides; nitrites (e.g. potassium nitrite, sodium nitrite, and calcium nitrite); hypochlorites (e.g. calcium hypochlorite); chlorinated isocyanuric acids (e.g. trichlorinated isocyanuric acid); peroxodisulfates (e.g. potassium peroxodisulfate, and sodium peroxodisulfate); and peroxoborates (e.g. potassium peroxoborate, sodium peroxoborate, and ammonium peroxoborate).

The metal oxide in the first conductive material composition of the present invention preferably is one or more selected from the group consisting of AgO, Ag$_2$O, and Ag$_2$O$_3$. These metal oxides promote the oxidation reaction of the silver particles, thereby, as a result, allowing the metal bonding to be achieved at a relatively low temperature. These metal oxides are preferable since they are decomposed by heat upon sintering, and thereafter, become silver. In the first conductive material composition of the present invention, the metal oxide more preferably is AgO. AgO as the metal oxide has a strong power of oxidation, and an added amount of the metal oxide therefore can be reduced. As a result, the electric resistance of the obtained conductive material is decreased, and the mechanical strength of the conductive material is improved.

As the metal oxide, one type having one average particle diameter (median diameter) may be used, or a mixture of two types having different average particle diameters may be used. In the case where the metal oxide is of one type, the metal oxide preferably has an average particle diameter (median diameter) of 0.1 μm to 15 μm. This is because in the case where the metal oxide has the above-described average diameter, it is possible to provide an excellent workability and to enable low-cost production. Further, in the case where the metal oxide is of one type, the metal oxide preferably has an average particle diameter (median diameter) of 0.1 μm to 10 μm, and more preferably, 0.3 μm to 5 μm. In the case where the metal oxides of two or more types are mixed, average particle diameters (median diameters) of the two types are, for example, 0.1 μm to 15 μm and 0.1 μm to 15 μm in combination, preferably 0.1 μm to 15 μm and 0.1 μm to 10 μm in combination, and more preferably 0.1 μm to 15 μm and 0.3 μm to 5 μm in combination. In the case where two or more of the metal oxides are mixed, the content of the type having an average particle diameter (median diameter) of 0.1 μm to 15 μm is, for example, 70 wt % or more, preferably 80 wt % or more, and more preferably 90 wt % or more.

In the present invention, the first conductive material composition preferably further contains either an organic solvent having a boiling point of 300° C. or lower, or water. This is because in the first method for producing a conductive material according to the present invention, the organic solvent or water improves the conformability between the silver particles, thereby promoting the reaction between the silver particles and the metal oxide. In the present invention, the second conductive material composition may further contain either an organic solvent having a boiling point of 300° C. or lower, or water. This is because the organic solvent or water improves the conformability between the silver particles, thereby promoting the reaction between the silver particles and the metal oxide.

In the present invention, the organic solvent preferably contains either a lower alcohol, or a lower alcohol having one or more substituents selected from the group consisting of lower alkoxy, amino, and halogen. The reason is as follows: such an organic solvent has high volatility, and therefore, residues of the organic solvent in the conductive material obtained after the first conductive material composition is sintered can be reduced. In the second conductive material composition of the present invention, the organic solvent may contain either a lower alcohol, or a lower alcohol having one or more substituents selected from the group consisting of lower alkoxy, amino, and halogen. The reason is as follows: such an organic solvent has high volatility, and therefore, residues of the organic solvent in the conductive material obtained after the first conductive material composition is sintered can be reduced. Examples of the lower alcohol include a lower alcohol having an alkyl group with 1 to 6 carbon atoms, and 1 to 3, or preferably 1 to 2, hydroxy groups. Examples of the lower alkyl group include straight-chain or branched-chain alkyl groups such as methyl group, ethyl group, n-propyl group, i-propyl group, n-butyl group, i-butyl group, sec-butyl group, t-butyl group, n-pentyl group, i-pentyl group, sec-pentyl group, t-pentyl group, 2-methylbutyl group, n-hexyl group, 1-methylpentyl group, 2-methylpentyl group, 3-methylpentyl group, 4-methylpentyl group, 1-ethylbutyl group. 2-ethylbutyl group, 1,1-dimetylbutyl group, 2,2-dimetylbutyl group, 3,3-dimetylbutyl group, and 1-ethyl 1-methylpropyl group. Examples of a lower alcohol having an alkyl group with 1 to 6 carbon atoms and 1 to 3 hydroxy groups include methanol, ethanol, ethylene glycol, n-propanol, i-propanol, triethylene glycol, n-butanol, i-butanol, sec-butanol, t-butanol, n-pentanol, i-pentanol, sec-pentanol, t-pentanol, 2-methyl butanol, n-hexanol, 1-methyl pentanol, 2-methyl pentanol, 3-methyl pentanol, 4-methyl pentanol, 1-ethyl butanol, 2-ethyl butanol, 1,1-dimethyl butanol, 2,2-dimethyl butanol, 3,3-dimethyl butanol, and 1-ethyl-1-methyl propanol.

In the lower alcohol having one or more substituents selected from the group consisting of lower alkoxy, amino, and halogen, the substituent is as follows. Examples of the lower alkoxy include the lower alkyl group having a substitute of —O—. Examples of the lower alkoxy include methoxy, ethoxy, n-propoxy, i-propoxy, n-butoxy, i-butoxy, sec-butoxy, t-butoxy, and n-pentyloxy. Examples of the halogen include fluorine, bromine, chlorine, and iodine.

Examples of the lower alcohol having not one or more substituents selected from the group consisting of lower alkoxy, amino, and halogen include methoxymethanol, 2-methoxyethanol, 2-ethoxyethanol, 2-chloroethanol, and ethanolamine.

The boiling point of the organic solvent preferably is 300° C. or lower. More preferably, the foregoing boiling point is 150° C. to 250° C. This makes it possible to suppress variation in the viscosity of the conductive material composition at room temperature owing to volatilization of the organic solvent, thereby improving the workability, and further, it is possible to allow the organic solvent to vaporize completely when heated.

Though the added amount of the organic solvent is not limited particularly, since the necessary viscosity thereof varies with the methods of application of the conductive material composition. However, in order to reduce the voidage of the conductive material, the added amount of the same preferably is 30 wt % or less.

In the present invention, the sintering step may be carried out in non-oxidizing atmosphere, ambient atmosphere, vacuum atmosphere, oxygen atmosphere, mixture gas atmosphere, or airflow. In the first method for producing a conductive material according to the present invention, the sintering step preferably is carried out in atmosphere of oxygen or ozone, or ambient atmosphere. The reason is as follows: in the case where the sintering step is carried out in the foregoing atmosphere, the oxidation reaction is promoted during the sintering step.

In the present invention, the sintering step preferably is carried out at a temperature in a range of 150° C. to 320° C. The reason is as follows: in the case where the sintering step is carried out at a temperature in the foregoing range, the metal bonding can be achieved at a temperature lower than a melting point of a resin package on which a semiconductor element or the like is mounted. Further, the sintering step preferably is carried out at a temperature in a range of 160° C. to 260° C., or more preferably in a range of 180° C. to 200° C.

The content of the metal oxide in the first conductive material composition of the present invention preferably is 5 wt % to 40 wt % with respect to the silver particles. This is because with the foregoing content, the conductive material obtained has a greater shear strength. The content of the metal oxide more preferably is 5 wt % to 30 we/0, and further preferably 10 wt %, with respect to the silver particles.

The conductive material of the present invention may contain particles of a conductive metal other than silver. Examples of the conductive metal include palladium, platinum, gold, and copper. Particles of the conductive metal has an average particle diameter (median diameter) of, for example, 0.1 μm to 15 μm, preferably 0.1 μm to 10 μm, and more preferably 0.3 μm to 5 μm. Further, the particles of the conductive metal have a specific area of, for example, 0.5 $m^2/g$ to 3 $m^2/g$, preferably 0.6 $m^2/g$ to 2.5 $m^2/g$, and more preferably 0.6 $m^2/g$ to 2 $m^2/g$.

Further, the present invention is a conductive material obtained by either the first or second method for producing a conductive material, in which the silver particles are fused to one another, and a voidage is 5 vol % to 35 vol %. The conductive material has an advantage of a high bonding strength. In the conductive material, the voidage preferably is 5 vol % to 25 vol %, and more preferably 5 vol % to 15 vol %.

The conductive material of the present invention preferably has a content of silver of 70 wt % or more. This is because this conductive material has a great bonding strength. The content of silver more preferably is 85 wt % or more, and further preferably 90 wt % to 100 we/0.

The conductive material of the present invention preferably has an electric resistance of $5.0 \times 10^{-5}$ Ω·cm or less. This is because this conductive material has a low electric resistance. The electric resistance more preferably is $1.0 \times 10^{-5}$ Ω·cm, and further preferably $7.0 \times 10^{-6}$ Ω·cm.

Further, an electronic device of the present invention is an electronic device containing the conductive material obtained by the first or second producing method of the present invention, wherein the conductive material is used as a material for electric wiring, component electrodes, die attaches, or microbumps. The electronic device, obtained using the foregoing conductive material, has an advantage of a sufficiently small electric resistance, and less variation in the electric resistance with time. The electronic device, obtained using the foregoing conductive material, has an advantage of high reliability, without a possibility of separation of bonded parts owing to a thermal shock.

With the present invention, it is possible to obtain a light-emitting device including a light-emitting element subjected to metal bonding with the foregoing conductive material as a bonding material. Examples of a method for bonding a light-emitting element and a wiring board, etc., include, generally, a method using an insulation adhesive, a method using an organic bonding material such as a conductive adhesive in which a conductive metal filler is dispersed, and a method using a metal bonding material such as a high-temperature lead solder or AuSu eutectic. The method using an organic bonding material, as described above, has a problem in that the organic component in the material degrades due to light or heat, and as a result causes the color or the strength to decrease, whereby the lifetime of the light-emitting device decreases. The method using a metal bonding material has a problem in that a plastic member of a light-emitting device significantly degrades due to heat since it is exposed to a high temperature over 300° C. upon bonding. In contrast, in the producing method of the present invention, the conductive material composition contains silver as a principal component, and does not need an adhesive. Therefore, if the conductive material obtained by the producing method of the present invention is used as a bonding material, it hardly is affected by light or heat, and a temperature required upon bonding in the foregoing producing method is in a range of 150° C. to 320° C., which is low. Therefore, it is possible to prevent a plastic member in a light-emitting device from degrading due to heat, and hence, the foregoing method is preferable. Further, the method for producing a conductive material according to the present invention does not cause a problem of a gas generated by decomposition caused by heat of abrupt reaction. Therefore, the conductive material obtained, in which the formation of irregular voids is suppressed, is excellent as a bonding material.

A light-emitting device of the present invention is a light-emitting device (first light-emitting device) containing a conductive material obtained by the first method for producing a conductive material according to the present invention, wherein the conductive material is used as a bonding material for bonding a light-emitting element to a wiring board or a lead frame. Using the foregoing conductive material, the first light-emitting device obtained has an advantage in that it has a sufficiently small electric resistance, and less variation in the electric resistance with time. Further, using the foregoing conductive material, the first light-emitting device obtained has an advantage in that the degradation and discoloration of the wiring board or the lead frame is suppressed. Still further, the first light-emitting device of the present invention has advantages in that light output therefrom has less decrease with time even if the device is driven for a long time, and that the device has long lifetime.

A light-emitting device of the present invention is a light-emitting device (second light-emitting device) containing a conductive material obtained by the second method for producing a conductive material according to the present invention, wherein the conductive material is used as a bonding material for bonding a light-emitting element to a wiring board or a lead frame. Using the foregoing conductive material, the second light-emitting device obtained has an advantage in that it has a sufficiently small electric resistance, and less variation in the electric resistance with time. Further, using the foregoing conductive material, the second light-emitting device obtained has an advantage in that the degradation and discoloration of the wiring board or the lead frame is suppressed. Still further, the second light-emitting device of the present invention has advantages in that light output therefrom has less decrease with time even if the device is driven for a long time, and that the device has long lifetime.

A light-emitting device of the present invention is a light-emitting device (third light-emitting device) containing a conductive material, the conductive material being obtained by heating a conductive paste containing silver particles having an average particle diameter (median diameter) of 0.1 μm to 15 μm and alcohol at 150° C. to 300° C., wherein the conductive material is used as a bonding material for bonding a light-emitting element to a wiring board or a lead frame. Using the foregoing conductive material, the third light-emitting device obtained has an advantage in that it has a sufficiently small electric resistance, and less variation in the electric resistance with time. Further, using the foregoing conductive material, the third light-emitting device obtained has an advantage in that the degradation and discoloration of the wiring board or the lead frame is suppressed. Still further, the third light-emitting device of the present invention has advantages in that light output therefrom has less decrease with time even if the device is driven for a long time, and that the device has long lifetime.

In the present invention, the wiring board is not limited particularly as long as a conductive material composition or a conductive paste can be applied over a surface of the wiring board. Examples of the wiring board include a semiconductor element; a ceramic substrate containing aluminum oxide, aluminum nitride, zirconium oxide, zirconium nitride, titanium oxide, titanium nitride, or a mixture of the same; a metal substrate containing Cu, Fe, Ni, Cr, Al, Ag, Au, Ti, or an alloy of the same; a glass epoxy substrate; a BT resin substrate; a glass substrate; a resin substrate; and paper. Using such a wiring substrate, the first, second, or third light-emitting device of the present invention has excellent heat resistance. Besides, according to the producing method of the present invention, a temperature for heating may be low. Therefore, a wiring board vulnerable to heat, such as that made of a thermoplastic resin, can be used.

Preferable as the wiring board is a ceramic substrate containing aluminum oxide, aluminum nitride, zirconium oxide, zirconium nitride, titanium oxide, titanium nitride, or a mixture of the same. In the case where the wiring substrate is a ceramic substrate, when a light-emitting element is made of a single crystal having a small coefficient of linear expansion, it is possible to prevent thermal stress from being applied to bonded portions at which the substrate and the light-emitting element are bonded. Further preferable as the wiring board is a ceramic substrate containing aluminum oxide. This is because in the case where the wiring board is a ceramic substrate containing aluminum oxide, the costs of the light-emitting device can be reduced.

In the present invention, used as the lead frame is, for example, a metal frame made of copper, iron, nickel, chromium, aluminum, silver, gold, titanium, or an alloy of the same. Among these metals, copper, iron, or an alloy of the same is preferable. As the lead frame, that made of a copper alloy is preferable in a light-emitting device that requires heat dissipation, and an iron alloy is preferable in a light-emitting device that requires reliability of bonding with a semiconductor element.

In the present invention, a surface of a portion of the wiring board or the lead frame on which the bonding material is to be applied may be coated with silver, an oxide of silver, a silver alloy, an oxide of a silver alloy, Pt, a Pt alloy, Sn, a Sn alloy, gold, a gold alloy, Cu, a Cu alloy, Rh, a Rh alloy, or the like, and preferably with an oxide of silver (silver oxide). The reason is as follows: since the surface part of the portion on which the bonding material is to be applied is made principally of silver, the surface part of the portion on which the bonding material is to be applied, if coated with silver oxide, have excellent fusibility with the bonding material. The coating can be carried out by plating, vapor deposition, sputtering, spreading, or the like.

In the present invention, a surface of the light-emitting element that is to be fused with the bonding material may be coated with silver, a silver alloy, Pt, a Pt alloy, Sn, a Sn alloy, gold, a gold alloy, copper, a copper alloy, Rh, a Rh alloy, or the like, and preferably is coated with silver. The reason is as follows: since the surface part of the portion on which the bonding material is to be applied is made principally of silver, the surface part of the portion on which the bonding material is to be applied, if coated with silver, have excellent fusibility with the bonding material. The coating can be carried out by plating, vapor deposition, sputtering, spreading, or the like.

In the first, second, and third light-emitting devices of the present invention, the lead frame preferably includes a metal member containing Cu, Fe, Ni, Co, Cr, Al, Ag, Au, Ti, or an alloy of the same, and more preferably includes a metal member containing Cu, Fe, Ni, Co, or an alloy of the same. The wiring board or the lead frame preferably is coated further with Ag, Au, Pt, Sn, Cu, Rh, or an alloy of the same, and more preferably with Ag, Au, Pt, or an alloy of the same.

Further, the present invention is a method for producing the first light-emitting device according to the present invention, and the method includes the steps of: applying a first conductive material composition that contains silver particles having an average particle diameter (median diameter) of 0.1 µm to 15 µm, and a metal oxide, over the wiring board or the lead frame; placing the light-emitting element on the first conductive material composition, so as to obtain a light-emitting device precursor; and sintering the light-emitting device precursor, so as to obtain a light-emitting device. With the method for producing the first light-emitting device, an organic material in the board or the lead frame can be prevented from degrading or discoloring, and a light-emitting device with high quality and high volume production capability can be produced easily. In the method for producing the first light-emitting device, the first conductive material composition preferably further contains either an organic solvent having a boiling point of 300° C. or lower, or water. The organic solvent preferably contains either a lower alcohol, or a lower alcohol having one or more substituents selected from the group consisting of lower alkoxy, amino, and halogen. The reason is as follows: if the first conductive material composition further contains the organic solvent or water, the silver particles can be contained in the organic solvent or water at a high concentration, without the workability being impaired, and therefore, the material has smaller shrinkage in volume after sintered. Consequently, it is easy to estimate dimensions of the conductive material to be obtained. Still further, since the conductive material obtained has smaller shrinkage in volume, closer adhesion thereof with the wiring board or the lead frame can be provided.

Further, the present invention is a method for producing the second light-emitting device, and the method includes the steps of: applying a second conductive material composition that contains silver particles having an average particle diameter (median diameter) of 0.1 µm to 15 µm over the wiring board or the lead frame; placing the light-emitting element on the second conductive material composition, so as to obtain a light-emitting device precursor; and sintering the light-emitting device precursor in atmosphere of oxygen or ozone, or ambient atmosphere, at 150° C. to 320° C., so as to obtain a light-emitting device. With the method for producing the second light-emitting device, an organic material in the board or the lead frame can be prevented from degrading or discoloring, whereby a light-emitting device with high quality and high volume production capability can be produced easily. Further, with the method for producing the second light-emitting device, metals can be bonded at a relatively low temperature of 150° C. to 320° C., and the bonded portion has a re-melting temperature equivalent to the melting point of silver of 962° C. Therefore, there is an advantage in that the reliability is not impaired even when the bonded portion is exposed to a temperature of 250° C. to 300° C. at which the light-emitting element to be obtained is mounted on a substrate. In the method for producing the second light-emitting device, the second conductive material composition may further contain either an organic solvent having a boiling point of 300° C. or lower, or water. The organic solvent may contain either a lower alcohol, or a lower alcohol having one or more substituents selected from the group consisting of lower alkoxy, amino, and halogen. In the case where the second conductive material composition further contains the organic solvent or water, the silver particles can be contained in the organic solvent or water at a high concentration, without the workability being impaired, the material has smaller shrinkage in volume after sintered. Therefore, there is an advantage that it is easy to estimate dimensions of the conductive material to be obtained. Further, since the shrinkage in volume of the conductive material obtained is small, there is an advantage that closer adhesion thereof with the wiring board or the lead frame can be provided.

Further, the present invention is a method for producing the third light-emitting device, and the method includes the steps of applying a conductive paste that contains silver particles having an average particle diameter (median diameter) of 0.1 µm to 15 µm and alcohol over the wiring board or the lead frame; placing the light-emitting element on the conductive paste, so as to obtain a light-emitting device precursor; and sintering the light-emitting device precursor at 150° C. to 300° C., so as to obtain a light-emitting device. With the method for producing the third light-emitting device, an organic material in the board or the lead frame can be prevented from degrading or discoloring, and a light-emitting device with high quality and high volume production capability can be produced easily. Further, with the method for producing the third light-emitting device, metals can be bonded at a relatively low temperature of 150° C. to 300° C., and the bonded portion has a re-melting temperature equivalent to the melting point of silver of 962° C. Therefore, there is an advantage in that the reliability is not impaired even when the bonded portion is exposed to a temperature of 250° C. to 300° C. at which the light-emitting element to be obtained is mounted on a substrate. In the case where the conductive paste further contains alcohol, the silver particles can be contained in the alcohol at a high concentration, without the workability being impaired, the material has smaller shrinkage in volume after sintered. Therefore, there is an advantage that it is easy to estimate dimensions of the conductive material to be obtained. Further, since the shrinkage in volume of the conductive material obtained is small, there is an advantage that closer adhesion thereof with the wiring board or the lead frame can be provided.

In the method for producing the third light-emitting device, the sintering step may be carried out in non-oxidizing atmosphere, ambient atmosphere, vacuum atmosphere, oxygen atmosphere, mixture gas atmosphere, or airflow. The sintering step preferably is carried out in ambient atmosphere, since this makes the formation economical.

In the method for producing the first light-emitting device and the method for producing the second light-emitting device, the step for applying a conductive material composition over a substrate is not limited particularly as long as the conductive material composition can be applied over a surface of a substrate, but the step may be carried out by printing, coating, or the like. Examples of the printing include screen printing, offset printing, ink jet printing, flexographic printing, dispenser printing, gravure printing, stamping, dispensing, squeeze printing, silk screen printing, spraying, and brush coating. Among these, screen printing, stamping, or dispensing is preferable. The conductive material composition thus applied has a thickness of, for example, 3 µm to 100 µm, preferably 3 µm to 50 µm, and more preferably 5 µm to 20 µm. For a light-emitting device having a size of 0.5 mm square or smaller, stamping or dispensing is preferable, between which stamping is more preferable. The stamping makes it possible to apply the composition accurately to fine regions, and furthermore, to increase the working speed.

In the method for producing the third light-emitting device, the step for applying a conductive paste over a substrate is not limited particularly as long as the conductive paste can be applied over a surface of a substrate, but the step may be carried out by printing, coating, or the like. Examples of the printing include screen printing, offset printing, ink jet printing, flexographic printing, dispenser printing, gravure printing, stamping, dispensing, squeeze printing, silk screen printing, spraying, and brush coating. Among these, screen printing, stamping, or dispensing is preferable. The conductive paste thus applied has a thickness of, for example, 3 µm to 100 µm, preferably 3 µm to 50 µm, and more preferably 5 µm to 20 µm. For a light-emitting device having a size of 0.5 mm square or smaller, stamping or dispensing is preferable, between which stamping is more preferable. The stamping makes it possible to apply the paste accurately to fine regions, and furthermore, to increase the working speed.

Each of the method for producing the first light-emitting device, the method for producing the second light-emitting device, and the method for producing the third light-emitting device may further include the step of laying metal wiring between electrodes of the light-emitting element and a wiring portion of the wiring board or the lead frame. Here, the metal wiring preferably is made of gold, silver, copper, or aluminum, and more preferably, gold. In the case where the metal wiring is made of gold, a stable bonding property is achieved, and corrosion less likely occurs.

Further, each of the method for producing the first light-emitting device, the method for producing the second light-emitting device, and the method for producing the third light-emitting device may further include the step of sealing the light-emitting device with a resin, an air-tight cover, or a non-air-tight cover. Examples of the resin used in the sealing step include epoxy resins, phenol resins, acrylic resins, polyimide resins, silicone resins, urethane resins, and thermoplastic resins. Among these, silicone resins are preferable, since a light-emitting device having excellent heat resistance and light resistance as well as long lifetime can be produced. As a material for the air-tight cover or the non-air-tight cover, the following can be used: inorganic glass; polyacrylic resin; polycarbonate resin; polyolefin resin; and norbornene resin. Among these, inorganic glass is preferable, since a light-emitting device having excellent heat resistance and light resistance as well as long lifetime can be produced.

A light-emitting device, obtained by the method for producing a light-emitting device according to the present invention, is configured so that the conductive material is disposed between the wiring substrate or the lead frame, and the light-emitting element. The conductive material has a thickness of, for example, 2 µm to 80 µm, preferably 2 µm to 40 µm, and more preferably 3 µm to 15 µm.

The method for producing a light-emitting device according to the present invention preferably further includes the step of applying an adhesive over the conductive material. With the step of applying the adhesive, the adhesion between the wiring board and the conductive material can be improved. A conductive material made of the conventional conductive composition containing an adhesive had a problem in that metal particles were insufficiently dense and an electric resistance was high. In contrast, with the method of the present invention, metal particles are sufficiently dense, and consequently, a conductive material having a low electric resistance can be obtained. In the case where such a method of the present invention further includes the step of applying an adhesive over the conductive material, it is possible to cause the conductive material to firmly adhere to the wiring board. As a result, a conductive material having a low electric resistance and high adhesion to the wiring board can be obtained, which is preferable.

Examples of the adhesive usable in the foregoing method include epoxy adhesives, phenol adhesives, acrylic adhesives, polyimide adhesives, silicone adhesives, urethane adhesives, and thermoplastic adhesives. Among these, epoxy adhesives are preferable as the foregoing adhesive.

Hereinafter, the average particle diameter (median diameter) is a value determined by the laser method, and the specific surface is a value determined by the BET method.

Example 1

Exothermic behaviors of mixture particles were checked by differential scanning calorimetry (DSC) in Examples 1 to 5 and Comparative Examples 1 to 5.

Specifically, 5 mg of mixture particles were sampled, and exothermic behaviors of the same were checked by differential scanning calorimetry (DSC). In the DSC measurement, the temperature was increased by 10° C. per minute, from room temperature to 250° C. At 250° C., the mixture particles were placed in an anodized aluminum container, and a lid was fitted thereafter. The atmosphere for the measurement was ambient atmosphere or nitrogen atmosphere. In the case where the nitrogen atmosphere was used for the measurement, the fitting of the lid was carried out in a glove box filled with nitrogen. It should be noted that alumina particles were used as a reference material. The compositional details of mixture particles, the atmosphere used for the measurement, the temperature at which heat generation starts, the amount of heat generated, and the state of fusion (fused/not fused) after measurement are shown in Table 1. In Table 1, "Silver" refers to silver particles having an average particle diameter of 2.0 μm to 3.2 μm (produced by Fukuda Metal Foil & Powder Co., Ltd., product name: "AgC-239"), "Silver (I) oxide" refers to silver (I) oxide ($Ag_2O$) particles having an average particle diameter of 18.5 μm (produced by Wako Pure Chemical Industries, Ltd., product name: "Silver (I) Oxide"), and "Silver (II) oxide" refers to silver (II) oxide (AgO) particles having an average particle diameter of 10.6 μm (produced by Wako Pure Chemical Industries, Ltd., product name: "Silver (II) Oxide").

Further, the silver particles used are as follows:

Silver particles produced by Fukuda Metal Foil & Powder Co., Ltd., having a product name of "AgC-239", have an average particle diameter (median diameter) of 2.0 μm to 3.2 μm, and a specific surface of 0.6 to 0.9 $m^2/g$.

Silver particles produced by Mitsui Mining & Smelting Co., Ltd., having a product name of "FHD", have an average particle diameter (median diameter) of 0.3 μm, and a specific surface of 2.54 $m^2/g$.

Silver particles produced by Mitsui Mining & Smelting Co., Ltd., having a product name of "EHD", have an average particle diameter (median diameter) of 0.5 μm, and a specific surface of 1.70 $m^2/g$.

Silver particles produced by Wako Pure Chemical Industries, Ltd., having a product name of "Silver (I) Oxide", have an average particle diameter (median diameter) of 18.5 μm.

Silver particles produced by Wako Pure Chemical Industries, Ltd., having a product name of "Silver (II) Oxide", have an average particle diameter (median diameter) of 10.6 μm.

TABLE 1

| Ex./Comp. Ex. | Compositional details of particles | | | Atmosphere used for measurement | Temperature of heat generation start (° C.) | Amount of generated heat (mJ/mg) | State of fusion |
|---|---|---|---|---|---|---|---|
| | Silver (wt %) | Silver (I) Oxide (wt %) | Silver (II) Oxide (wt %) | | | | |
| Ex. 1 | 100 | 0 | 0 | Ambient atmosphere | 138 | 2.85 | Fused |
| Comp. Ex. 1 | 100 | 0 | 0 | Nitrogen Atmosphere | 130 | 0.81 | Not fused |
| Comp. Ex. 2 | 0 | 100 | 0 | Ambient atmosphere | 98 | 6.18 | Not fused |
| Comp. Ex. 3 | 0 | 100 | 0 | Nitrogen Atmosphere | 127 | 1.69 | Not fused |
| Ex. 2 | 90 | 10 | 0 | Ambient atmosphere | 108 | 97 | Fused |
| Ex. 3 | 90 | 10 | 0 | Nitrogen Atmosphere | 107 | 92.5 | Fused |
| Comp. Ex. 4 | 0 | 0 | 100 | Ambient atmosphere | 147 | 21.8 | Not fused |
| Comp. Ex. 5 | 0 | 0 | 100 | Nitrogen Atmosphere | 136 | 25.4 | Not fused |
| Ex. 4 | 90 | 0 | 10 | Ambient atmosphere | 103 | 63.3 | Fused |
| Ex. 5 | 90 | 0 | 10 | Nitrogen Atmosphere | 111 | 75.6 | Fused |

As shown in Table 1, the results of Example 1 and Comparative Example 1 proved that when the second conductive material composition containing silver particles having an average particle diameter (median diameter) of 0.1 μm to 15 μm was heated in ambient atmosphere, the particles were fused. Besides, the result that an amount of generated heat in Example 1 was very small proved that any problem due to intense heat generation did not occur.

As shown in Table 1, the results of Comparative Examples 2 to 5 proved that when either only silver (I) oxide particles or only silver (II) oxide particles were heated in nitrogen atmosphere or ambient atmosphere, the particles were not fused.

As shown in Table 1, the results of Examples 2 to 5 proved that in the case of mixture particles containing silver particles and silver (I) oxide particles, and in the case of mixture particles containing silver particles and silver (II) oxide particles, an amount of generated heat was relatively large. This amount of generated heat was several tens of times greater, in weight terms, than an amount of generated heat when particles of silver oxide of either type alone were heated. This fact proved that the silver particles and the silver oxide particles reacted at portions where they were in contact with one another. Further, it was proved that even in nitrogen atmosphere containing no oxygen, fusion occurred when mixture particles containing silver particles and silver oxide particles were heated. In other words, it can be presumed that silver oxide particles reacted with silver particles, thereby becoming a source of oxygen.

Reference Example 1

Silver particles having an average particle diameter of 10 μm (produced by Fukuda Metal Foil & Powder Co., Ltd., product name: "AgC-224", 2.5 g), and 2-ethyl-1,3-hexanediol (0.3 g) were mixed at 25° C., whereby a conductive paste was obtained. The conductive paste thus obtained was applied over a glass substrate (thickness: 1 mm) by screen printing, so as to have a thickness of 200 μm. The glass substrate over which the conductive paste was applied was heated in nitrogen atmosphere at 150° C. The obtained wiring had a thickness of 160 μm to 190 μm, and an electric resistance of $9.9 \times 10^{-6}$ Ω·cm.

Reference Example 2

An experiment was carried out in the same manner as that in Reference Example 1 except that the heating temperature was set at 300° C., instead of 150° C. The obtained wiring had an electric resistance of $4.2 \times 10^{-6}$ Ω·cm.

Example 6

Silver particles (produced by Fukuda Metal Foil & Powder Co., Ltd., product name: "AgC-224", 1.75 g), and silver (II) oxide particles having an average particle diameter of 10 μm (produced by Wako Pure Chemical Industries, Ltd., product name: "Silver (II) Oxide", 1.25 g) were mixed at 25° C., whereby a first conductive material composition was obtained. The first conductive material composition thus obtained was applied over a glass substrate (thickness: 1 mm) by screen printing, so as to have a thickness of 200 μm. The glass substrate over which the first conductive material composition was applied was heated in nitrogen atmosphere of 150° C. The obtained wiring had a thickness of 160 μm to 190 μm, and an electric resistance of $4.9 \times 10^{-5}$ Ω·cm.

Example 7

An experiment was carried out in the same manner as that in Example 6 except that, as atmosphere used for heating, ambient atmosphere was used in place of nitrogen atmosphere. The obtained wiring had an electric resistance of $4.4 \times 10^{-5}$ Ω·cm.

Example 8

An experiment was carried out in the same manner as that in Example 6 except that the heating temperature was set at 300° C., instead of 150° C. The obtained wiring had an electric resistance of $1.3 \times 10^{-5}$ Ω·cm.

Example 9

An experiment was carried out in the same manner as that in Example 7 except that the heating temperature was set at 300° C., instead of 150° C. The obtained wiring had an electric resistance of $1.2 \times 10^{-5}$ Ω·cm.

Example 10

An experiment was carried out in the same manner as that in Example 6 except that silver (II) oxide particles having an average particle diameter of 0.3 μm (1.25 g) were used in place of the silver (II) oxide particles having an average particle diameter of 10 μm. The obtained wiring had an electric resistance of 3 $0.9 \times 10^{-5}$ Ω·cm.

Example 11

An experiment was carried out in the same manner as that in Example 10 except that, as atmosphere used for heating, ambient atmosphere was used in place of nitrogen atmosphere. The obtained wiring had an electric resistance of $4.8 \times 10^{-5}$ Ω·cm.

Example 12

An experiment was carried out in the same manner as that in Example 10 except that the heating temperature was set at 300° C., instead of 150° C. The obtained wiring had an electric resistance of $2.2 \times 10^{-5}$ Ω·cm.

Example 13

An experiment was carried out in the same manner as that in Example 11 except that the heating temperature was set at 300° C., instead of 150° C. The obtained wiring had an electric resistance of $3.3 \times 10^{-5}$ Ω·cm.

Reference Example 3

An experiment was carried out in the same manner as that in Reference Example 1 except that silver particles having an average particle diameter of 0.3 μm (produced by Mitsui Mining & Smelting Co., Ltd., product name: "FHD", 2.5 g) were used in place of the silver particles having an average particle diameter of 10 μm. The obtained wiring had an electric resistance of $1.1 \times 10^{-5}$ Ω·cm.

Reference Example 4

An experiment was carried out in the same manner as that in Reference Example 2 except that silver particles having an average particle diameter of 0.3 μm (produced by Mitsui Mining & Smelting Co., Ltd., product name: "FHD", 2.5 g) were used in place of the silver particles having an average particle diameter of 10 μm. The obtained wiring had an electric resistance of $5.2 \times 10^{-5}$ Ω·cm.

Example 14

An experiment was carried out in the same manner as that in Example 6 except that silver particles having an average particle diameter of 0.3 μm (1.75 g) were used in place of the silver particles having an average particle diameter of 10 μm. The obtained wiring had an electric resistance of $4.3 \times 10^{-5}$ Ω·cm.

Example 15

An experiment was carried out in the same manner as that in Example 14 except that, as atmosphere used for heating, ambient atmosphere was used in place of nitrogen atmosphere. The obtained wiring had an electric resistance of $4.9 \times 10^{-5}$ Ω·cm.

Example 16

An experiment was carried out in the same manner as that in Example 14 except that the heating temperature was set at 300° C., instead of 150° C. The obtained wiring had an electric resistance of $1.2 \times 10^{-5}$ Ω·cm.

Example 17

An experiment was carried out in the same manner as that in Example 18 except that the heating temperature was set at 300° C., instead of 150° C. The obtained wiring had an electric resistance of $1.2 \times 10^{-5}$ Ω·cm.

Example 18

An experiment was carried out in the same manner as that in Example 10 except that silver (II) oxide particles having an average particle diameter of 0.3 μm (1.75 g) were used in place of the silver (II) oxide particles having an average particle diameter of 10 μm. The obtained wiring had an electric resistance of $4.7 \times 10^{-5}$ Ω·cm.

Example 19

An experiment was carried out in the same manner as that in Example 14 except that, as atmosphere used for heating, ambient atmosphere was used in place of nitrogen atmosphere. The obtained wiring had an electric resistance of $3.9 \times 10^{-5}$ Ω·cm.

Example 20

An experiment was carried out in the same manner as that in Example 18 except that the heating temperature was set at 300° C., instead of 150° C. The obtained wiring had an electric resistance of $2.2 \times 10^{-5}$ Ω·cm.

Example 21

An experiment was carried out in the same manner as that in Example 19 except that the heating temperature was set at 300° C., instead of 150° C. The obtained wiring had an electric resistance of $1.5 \times 10^{-5}$ Ω·cm.

The silver particles used in Reference Examples 1 to 4 and Examples 6 to 21 are as follows:

Silver particles produced by Fukuda Metal Foil & Powder Co., Ltd., having a product name of "AgC-224", have an average particle diameter (median diameter) of 6.5 μm to 9.0 μm, and a specific surface of 0.25 m²/g to 0.40 m²/g.

Silver particles produced by Mitsui Mining & Smelting Co., Ltd., having a product name of "FHD", have an average particle diameter (median diameter) of 0.3 μm, and a specific surface of 2.54 m²/g.

Silver particles produced by Wako Pure Chemical Industries, Ltd., having a product name of "Silver (II) Oxide", have an average particle diameter (median diameter) of 10.6 μm.

Silver (II) oxide particles having an average particle diameter of 0.3 μm were produced in-house in the following manner. Each of silver nitrate and ammonium persulfate was dissolved in pure water, and solutions obtained were mixed and stirred; then, particles precipitated were settled out, separated, and washed with water.

Table 2 shows the compositional details of conductive pastes in Reference Examples 1 to 4 and the compositional details of conductive material compositions in examples 6 to 21, as well as, as to each of the conductive pastes and the conductive material compositions, the heating temperature, the atmosphere used for heating, and a resistance of a conductive material obtained after heating. In Table 2, "Silver 10 μm" refers to silver particles having an average particle diameter of 6.5 μm to 9.0 μm (produced by Fukuda Metal Foil & Powder Co., Ltd., product name: AgC-224), "Silver 0.3 μm" refers to silver particles having an average particle diameter of 0.3 μm (produced by Mitsui Mining & Smelting Co., Ltd., product name: "FHD"), "Silver (II) oxide 10 μm" refers to silver (II) oxide (AgO) particles having an average particle diameter of 10.6 μm (produced by Wako Pure Chemical Industries, Ltd., product name: "Silver (II) oxide"), and "Silver (II) oxide 0.3 μm" refers to silver (II) oxide (AgO) particles having an average particle diameter of 0.3 μm (produced in-house).

TABLE 2

| | Compositional details of particles | | | | | | |
|---|---|---|---|---|---|---|---|
| Example | Silver 10 μm (wt %) | Silver 0.3 μm (wt %) | Silver (II) oxide 10 μm (wt %) | Silver (II) oxide 0.3 μm (wt %) | Heating temp. (° C.) | Atmosphere used for heating | Resistance (Ω · cm) |
| Ref. Ex. 1 | 100 | 0 | 0 | 0 | 150 | Ambient atm. | $9.9 \times 10^{-6}$ |
| Ref. Ex. 2 | 100 | 0 | 0 | 0 | 300 | Ambient atm. | $4.2 \times 10^{-6}$ |
| Ex. 6 | 70 | 0 | 30 | 0 | 150 | Nitrogen atm. | $4.9 \times 10^{-5}$ |
| Ex. 7 | 70 | 0 | 30 | 0 | 150 | Ambient atm. | $4.4 \times 10^{-5}$ |
| Ex. 8 | 70 | 0 | 30 | 0 | 300 | Nitrogen atm. | $1.3 \times 10^{-5}$ |
| Ex. 9 | 70 | 0 | 30 | 0 | 300 | Ambient atm. | $1.2 \times 10^{-5}$ |

TABLE 2-continued

| | Compositional details of particles | | | | | | |
|---|---|---|---|---|---|---|---|
| Example | Silver 10 μm (wt %) | Silver 0.3 μm (wt %) | Silver (II) oxide 10 μm (wt %) | Silver (II) oxide 0.3 μm (wt %) | Heating temp. (° C.) | Atmosphere used for heating | Resistance (Ω · cm) |
| Ex. 10 | 70 | 0 | 0 | 30 | 150 | Nitrogen atm. | $3.9 \times 10^{-5}$ |
| Ex. 11 | 70 | 0 | 0 | 30 | 150 | Ambient atm. | $4.8 \times 10^{-5}$ |
| Ex. 12 | 70 | 0 | 0 | 30 | 300 | Nitrogen atm. | $2.2 \times 10^{-5}$ |
| Ex. 13 | 70 | 0 | 0 | 30 | 300 | Ambient atm. | $3.3 \times 10^{-5}$ |
| Ref. Ex. 3 | 0 | 100 | 0 | 0 | 150 | Ambient atm. | $1.1 \times 10^{-5}$ |
| Ref. Ex. 4 | 0 | 100 | 0 | 0 | 300 | Ambient atm. | $5.2 \times 10^{-5}$ |
| Ex. 14 | 0 | 70 | 30 | 0 | 150 | Nitrogen atm. | $4.3 \times 10^{-5}$ |
| Ex. 15 | 0 | 70 | 30 | 0 | 150 | Ambient atm. | $4.9 \times 10^{-5}$ |
| Ex. 16 | 0 | 70 | 30 | 0 | 300 | Nitrogen atm. | $1.2 \times 10^{-5}$ |
| Ex. 17 | 0 | 70 | 30 | 0 | 300 | Ambient atm. | $1.2 \times 10^{-5}$ |
| Ex. 18 | 0 | 70 | 0 | 30 | 150 | Nitrogen atm. | $4.7 \times 10^{-5}$ |
| Ex. 19 | 0 | 70 | 0 | 30 | 150 | Ambient atm. | $3.9 \times 10^{-5}$ |
| Ex. 20 | 0 | 70 | 0 | 30 | 300 | Nitrogen atm. | $2.2 \times 10^{-5}$ |
| Ex. 21 | 0 | 70 | 0 | 30 | 300 | Ambient atm. | $1.5 \times 10^{-5}$ |

The results of Reference Examples 1 and 2 and Examples 6 to 9 shown in Table 2 proved that when a conductive paste or a conductive material composition was heated, a higher concentration of oxygen allowed a conductive material with a lower electric resistance to be obtained. Further, the results also show that the heating temperature of 300° C. allowed a conductive material with a lower electric resistance to be obtained, as compared with the heating temperature of 150° C.

As shown in Table 2, the results of Reference Examples 1 to 4 and Examples 6 to 21 proved that every conductive material that was obtained by heating the conductive paste or the conductive material composition had an electric resistance of $5.0 \times 10^{-5}$ Ω·cm or less. Since such a conductive composition did not contain a resin component, a bonding material with high reliability was obtained.

Example 22

A dam was formed with a mask on a glass substrate (thickness: 1 mm), and the second conductive material composition containing silver particles having an average particle diameter of 10 μm (produced by Fukuda Metal Foil & Powder Co., Ltd., product name: "AgC-224", 2.5 g) was filled under pressure into the dam in such a manner that the composition had a thickness of 200 μm and the silver particles were not be plastically deformed. The glass substrate, on which the silver particles were thus placed, was heated at 200° C. in ambient atmosphere. The wiring obtained had a voidage of 8.2%, and an electric resistance of 3 $0.7 \times 10^{-6}$ Ω·cm.

Reference Example 5

Silver particles having an average particle diameter of 10 μm (Fukuda Metal Foil & Powder Co., Ltd., product name: "AgC-224", 2.5 g) and 2-ethyl-1,3-hexanediol (0.28 g) were mixed at 25° C., whereby a conductive paste was obtained. The content of 2-ethyl-1,3-hexanediol in the paste was 10 wt %. The conductive paste obtained was applied over a glass substrate (thickness: 1 mm) by screen printing, so as to have a thickness of 200 μm. The glass substrate, over which the conductive paste was applied, was heated at 200° C. in ambient atmosphere. The wiring obtained had a voidage of 21.3%, and an electric resistance of $8.3 \times 10$ Ω·cm.

Reference Example 6

An experiment was carried out in the same manner as that in Reference Example 5 except that the weight of 2-ethyl-1,3-hexanediol was set at, not 0.28 g, but 0.44 g, and the content thereof in the paste was set at 15 wt %. The wiring obtained had a voidage of 27.5%, and an electric resistance of $1.2 \times 10^{-5}$ Ω·cm.

Reference Example 7

An experiment was carried out in the same manner as that in Reference Example 5 except that the weight of 2-ethyl-1,3-hexanediol was set at, not 0.28 g, but 0.63 g, and the content thereof in the paste was set at 20 wt %. The wiring obtained had a voidage of 35.1%, and an electric resistance of $7.2 \times 10^{-5}$ Ω·cm.

Reference Example 8

An experiment was carried out in the same manner as that in Reference Example 5 except that the weight of 2-ethyl-1,3-hexanediol was set at, not 0.28 g, but 0.84 g, and the content thereof in the paste was set at 30 wt %. The wiring obtained had a voidage of 42.9%, and an electric resistance of $3.1 \times 10$ Ω·cm.

Figure 2:
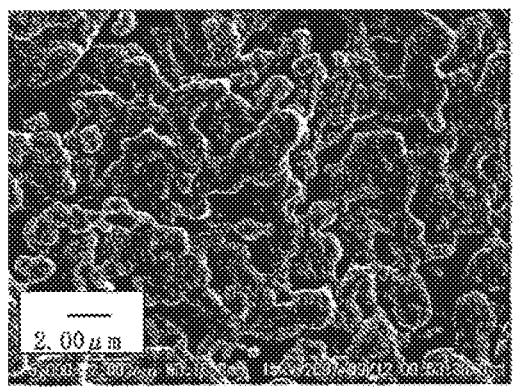
FIG. 2 is an electron micrograph showing a conductive composition obtained in Reference Example 8.

Table 3 shows the compositional details of the conductive material composition of Example 22, and the added amount of a solvent, the voidage and resistance of a conductive material obtained by heating the conductive paste or the conductive material composition as to each of Reference Examples 5 to 8 An electron micrograph of the conductive material obtained in Example 22 is shown in FIG. 1. An electron micrograph of the conductive material obtained in Reference Example 8 is shown in FIG. 2.

TABLE 3

| Example | Added amount of solvent (wt %) | Voidage (% by area) | Resistance (Ω · cm) |
|---|---|---|---|
| Ex. 22 | 0 | 8.2 | $3.7 \times 10^{-6}$ Ω · cm |
| Ref. Ex. 5 | 10 | 21.3 | $8.3 \times 10^{-6}$ Ω · cm |
| Ref. Ex. 6 | 15 | 27.5 | $1.2 \times 10^{-5}$ Ω · cm |
| Ref. Ex. 7 | 20 | 35.1 | $7.2 \times 10^{-5}$ Ω · cm |
| Ref. Ex. 8 | 30 | 42.9 | $3.1 \times 10^{-4}$ Ω · cm |

As shown in Table 3, the results of Example 22 and Reference Examples 5 to 8 proved that the voidage was influenced most by the amount of solvent in the conductive paste. Further, as shown in FIG. 1, it was proved that when no solvent was used and silver particles were filled under pressure, voids decreased, since no volume portion was occupied by a solvent and no path for allowing volatile solvent to pass through was needed. As shown in FIG. 2, it was proved that when a large amount of solvent was used, the voidage increased, since certain volume portions were occupied by the solvent and paths for discharge of vaporized solvent were needed.

Comparative Example 6

Silver particles (produced by Fukuda Metal Foil & Powder Co., Ltd., product name: "AgC-239", 2.5 g), and 2-ethyl-1,3-hexanediol (0.3 g) were mixed at 25° C., whereby a composition was obtained. The composition obtained was applied on a silver-plated surface of an alumina substrate by stamping, and a sapphire dice having one surface metallized with silver, in a size of 500 μm×500 μm×100 μm (thickness), was mounted thereon. This was heated at 200° C. in nitrogen atmosphere. A shearing power was applied in such a direction that the dice was separated from the alumina substrate, and a strength when the dice separated therefrom was measured. The strength was 52 gf.

Example 23

Silver particles (produced by Fukuda Metal Foil & Powder Co., Ltd., product name: "AgC-239", 2.375 g), silver (II) oxide (produced by Wako Pure Chemical Industries, Ltd., product name: "Silver (II) Oxide", 0.125 g), and 2-ethyl-1,3-hexanediol (0.3 g) were mixed at 25° C., whereby a first conductive material composition was obtained. The composition obtained was applied on a silver-plated surface of an alumina substrate by stamping, and a sapphire dice having one surface metallized with silver, in a size of 500 μm×500 μm×100 μm (thickness), was mounted thereon. This was heated at 200° C. in nitrogen atmosphere. A shearing power was applied in such a direction that the dice was separated from the alumina substrate, and a strength when the dice separated therefrom was measured. The strength was 392 gf.

Example 24

An experiment was carried out in the same manner as that in Example 23 except that silver particles (produced by Fukuda Metal Foil & Powder Co., Ltd., product name: "AgC-239", 2.25 g) and silver (II) oxide (produced by Wako Pure Chemical Industries, Ltd., product name: "Silver (II) Oxide", 0.25 g) were used in place of the silver particles (produced by Fukuda Metal Foil & Powder Co., Ltd., product name: "AgC-239", 2.375 g) and the silver (II) oxide (produced by Wako Pure Chemical Industries, Ltd., product name: "Silver (II) Oxide", 0.125 g). The shear strength measured was 553 gf.

Example 25

An experiment was carried out in the same manner as that in Example 23 except that silver particles (produced by Fukuda Metal Foil & Powder Co., Ltd., product name: "AgC-239", 2.0 g) and silver (II) oxide (produced by Wako Pure Chemical Industries, Ltd., product name: "Silver (II) Oxide", 0.5 g) were used in place of the silver particles (produced by Fukuda Metal Foil & Powder Co., Ltd., product name: "AgC-239", 2.375 g) and the silver (II) oxide (produced by Wako Pure Chemical Industries, Ltd., product name: "Silver (II) Oxide", 0.125 g). The shear strength measured was 478 gf.

Example 26

An experiment was carried out in the same manner as that in Example 23 except that silver particles (produced by Fukuda Metal Foil & Powder Co., Ltd., product name: "AgC-239", 1.75 g) and silver (II) oxide (produced by Wako Pure Chemical Industries, Ltd., product name: "Silver (II) Oxide", 0.75 g) were used in place of the silver particles (produced by Fukuda Metal Foil & Powder Co., Ltd., product name: "AgC-239", 2.375 g) and the silver (II) oxide (produced by Wako Pure Chemical Industries, Ltd., product name: "Silver (II) Oxide", 0.125 g). The shear strength measured was 322 gf.

Example 27

An experiment was carried out in the same manner as that in Example 23 except that silver particles (produced by Fukuda Metal Foil & Powder Co., Ltd., product name: "AgC-239", 1.25 g) and silver (II) oxide (produced by Wako Pure Chemical Industries, Ltd., product name: "Silver (II) Oxide", 1.25 g) were used in place of the silver particles (produced by Fukuda Metal Foil & Powder Co., Ltd., product name: "AgC-239", 2.375 g) and the silver (II) oxide (produced by Wako Pure Chemical Industries, Ltd., product name: "Silver (II) Oxide", 0.125 g). The shear strength measured was 157 gf.

Example 28

Silver particles (produced by Fukuda Metal Foil & Powder Co., Ltd., product name: "AgC-239", 2.5 g), and 2-ethyl-1,3-hexanediol (0.3 g) were mixed at 25° C., whereby a first conductive material composition was obtained. The composition obtained was applied on a silver-plated surface of an alumina substrate by stamping, and a sapphire dice having one surface metallized with silver, in a size of 500 μm×500 μm×100 μm (thickness), was mounted thereon. This was heated at 200° C. in atmospheric nitrogen atmosphere. A shearing power was applied in such a direction that the dice was separated from the alumina substrate, and a strength when the dice separated therefrom was measured. The strength was 722 gf.

Example 29

An experiment was carried out in the same manner as that in Example 23 except that, as atmosphere used for heating, ambient atmosphere was used in place of nitrogen atmosphere. The shearing strength measured was 703 gf.

Example 30

An experiment was carried out in the same manner as that in Example 24 except that, as atmosphere used for heating, ambient atmosphere was used in place of nitrogen atmosphere. The shearing strength measured was 664 gf.

Example 31

An experiment was carried out in the same manner as that in Example 25 except that, as atmosphere used for heating, ambient atmosphere was used in place of nitrogen atmosphere. The shearing strength measured was 544 gf.

Example 32

An experiment was carried out in the same manner as that in Example 26 except that, as atmosphere used for heating, ambient atmosphere was used in place of nitrogen atmosphere. The shearing strength measured was 391 gf.

Example 33

An experiment was carried out in the same manner as that in Example 27 except that, as atmosphere used for heating, ambient atmosphere was used in place of nitrogen atmosphere. The shearing strength measured was 123 gf.

As to each of Comparative Example 6 and Examples 23 to 33, Table 4 shows the content of silver (II) oxide in a conductive material composition, the atmosphere used for heating, and the shearing strength of a conductive material obtained.

TABLE 4

| Example | Silver (II) oxide (wt %) | Atmosphere used for heating | Shearing strength (gf) |
|---|---|---|---|
| Comp. Ex. 6 | 0 | Nitrogen atm. | 52 |
| Ex. 23 | 5 | Nitrogen atm. | 392 |
| Ex. 24 | 10 | Nitrogen atm. | 553 |
| Ex. 25 | 20 | Nitrogen atm. | 478 |
| Ex. 26 | 30 | Nitrogen atm. | 322 |
| Ex. 27 | 50 | Nitrogen atm. | 157 |
| Ex. 28 | 0 | Ambient atm. | 722 |
| Ex. 29 | 5 | Ambient atm. | 703 |
| Ex. 30 | 10 | Ambient atm. | 664 |
| Ex. 31 | 20 | Ambient atm. | 544 |
| Ex. 32 | 30 | Ambient atm. | 391 |
| Ex. 33 | 50 | Ambient atm. | 123 |

As shown in Table 4, the results of Comparative Example 6 and Examples 23 to 27 proved that when a first conductive material composition containing silver particles having an average particle diameter of 0.1 µm to 15 µm and a metal oxide were heated, a conductive material having a sufficient shear strength was obtained. Further, the results of Examples 28 to 33 proved that when a first conductive material composition containing silver particles having an average particle diameter of 0.1 µm to 15 µm was sintered in ambient atmosphere, a conductive material having a sufficient shear strength was obtained.

Example 34

Figure 3:
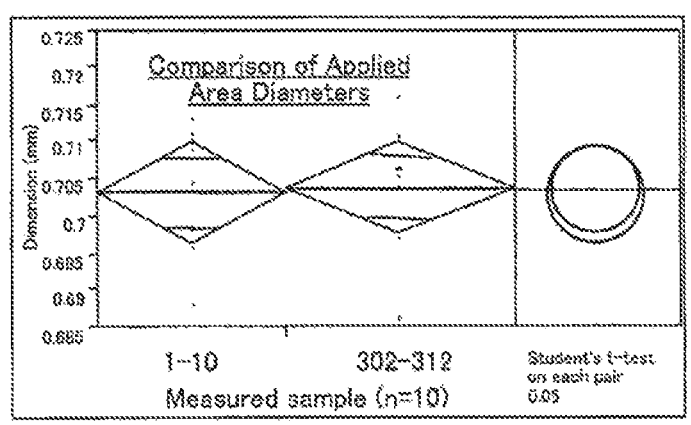
FIG. 3 is a graph showing variation in amounts applied by stamping in Example 34.

Silver particles (produced by Fukuda Metal Foil & Powder Co., product name: "AgC-239", 2.5 g) and 2-ethyl-1,3-hexanediol having a boiling point of 243° C. (0.44 g) were mixed at 25° C., whereby a second conductive material composition was obtained. This composition was applied by stamping over an aluminum oxide substrate for a light-emitting device, with a pattern being formed on the substrate by Ag/Ni plating. The area subjected to application was a perfect circle in shape, and had a diameter of about 700 µm in size. The application was carried out continuously 312 times, and diameters of applied areas obtained at the first ten times immediately after the start, and those at the last ten times in chronological order, were measured. Then, it was determined by Student's t-test whether there was a significant difference therebetween. FIG. 3 shows a variation of the amount of the composition applied by stamping.

As shown in FIG. 3, the results of Example 34 proved that in the case where a second conductive material composition containing silver particles having an average particle diameter of 0.1 µm to 10 µm and alcohol was applied by stamping, a confidence interval with 95% reliability with respect to the diameter average of the applied areas obtained at the first ten times immediately after the start, and that of the applied areas obtained at the last ten times, were substantially identical, and no significant difference was seen therebetween. In other words, it was proved that the stamping can be carried out using a conductive material composition containing no adhesive. Further, it was proved that since an organic solvent having a high boiling point was contained, the deterioration of the stamping stability due to volatilization of an organic solvent was avoided.

Example 35

A 500 µm-square light-emitting element was mounted on the surface on which the conductive material composition was applied by stamping in Example 34. Metal films were formed by vapor deposition on a surface where the light-emitting element and the conductive material composition were in contact with each other, and the topmost film was made of silver (thickness: 0.2 µm). The substrate on which the light-emitting element was mounted with the conductive material composition being interposed therebetween was heated at 200° C. for one hour in ambient atmosphere. Thereafter the substrate was cooled. The light-emitting element exhibited a sufficient strength of bonding with the substrate. Further, the bonded portion at which the light-emitting element and the substrate were bonded was checked by visual observation, and the fusion of particles in the bonding material was observed. As to the substrate on which the light-emitting element was bonded, a die-shear strength was measured at room temperature, and was determined to be about 0.7 kgf.

On the light-emitting element of the substrate, another aluminum oxide substrate for a light-emitting device was mounted, and was heated further at 250° C. for two hours. Here, it was noted that the bonded portions of silver between the light-emitting element and the substrate did not have any discoloration. As to this bonding between the light-emitting element and the substrate, a die-shear strength was measured at room temperature, and was determined to be about 0.7 kgf.

Next, electrodes of the light-emitting element and electrodes of the substrate were connected with gold wiring, and were sealed with a silicone resin. In this state, power-on tests (test conditions: 25° C., 50 mA) were carried out after a lapse of 500 hours, after a lapse of 1000 hours, and after a lapse of 2000 hours. The output results with respect to the initial outputs are shown in Table 5. It should be noted that after a lapse of 2000 hours, no discoloration occurred at the bonded portions of silver between the light-emitting element and the substrate.

Comparative Example 7

An insulative epoxy resin (curing conditions: 180° C., 2 hours) was applied by stamping over an aluminum oxide substrate for a light-emitting device, with a pattern being formed on the substrate by Ag/Ni plating. The applied area was a perfect circle in shape, and had a diameter of about 700 μm in size. A light-emitting element was mounted on the foregoing adhesive. The substrate on which the light-emitting element was thus mounted with the adhesive provided therebetween was heated at 200° C. for 1 hour in ambient atmosphere. Thereafter, the substrate was cooled. As to the substrate on which the light-emitting element was bonded, a die-shear strength was measured at room temperature, and was determined to be about 1 kgf.

On the light-emitting element of the substrate, another aluminum oxide substrate for a light-emitting device was mounted, and was heated further at 250° C. for two hours. Here, it was noted that the bonded portions of silver between the light-emitting element and the substrate had discoloration into blackish-brownish color. As to this bonding between the light-emitting element and the substrate, a die-shear strength was measured at room temperature, and was determined to be about 0.4 kgf.

Next, electrodes of the light-emitting element and electrodes of the substrate were connected with gold wiring, and were sealed with a silicone resin. In this state, power-on tests (test conditions: 25° C., 50 mA) were carried out after a lapse of 500 hours, after a lapse of 1000 hours, and after a lapse of 2000 hours. The output results with respect to the initial outputs are shown in Table 5. It should be noted that after a lapse of 2000 hours, discoloration to blackish-brownish color occurred at the bonded portions of silver between the light-emitting element and the substrate.

Comparative Example 8

A silver paste containing 80 wt % of a flake-form silver filler and 20 wt % of an epoxy resin (curing conditions: 200° C., 1.5 hours) was applied by stamping over an aluminum oxide substrate for a light-emitting device, with a pattern being formed on the substrate by Ag/Ni plating. The applied area was a perfect circle in shape, and had a diameter of about 700 μm in size. A light-emitting element was mounted on the foregoing adhesive. The substrate on which the light-emitting element was thus mounted with the adhesive provided therebetween was heated at 200° C. for 1 hour in ambient atmosphere. Thereafter, the substrate was cooled. As to the substrate on which the light-emitting element was bonded, a die-shear strength was measured at room temperature, and was determined to be about 0.7 kgf.

On the light-emitting element of the substrate, another aluminum oxide substrate for a light-emitting device was mounted, and was heated further at 250° C. for two hours. Here, it was noted that the bonded portions of silver between the light-emitting element and the substrate had discoloration into blackish-brownish color. As to this bonding between the light-emitting element and the substrate, a die-shear strength was measured at room temperature, and was determined to be about 0.6 kgf.

Next, electrodes of the light-emitting element and electrodes of the substrate were connected with gold wiring, and were sealed with a silicone resin. In this state, power-on tests (test conditions: 25° C., 50 mA) were carried out after a lapse of 500 hours, after a lapse of 1000 hours, and after a lapse of 2000 hours. The output results with respect to the initial outputs are shown in Table 5. It should be noted after a lapse of 2000 hours, discoloration to blackish-brownish color occurred at the bonded portions of silver between the light-emitting element and the substrate.

TABLE 5

|  | Bonding | After lapse of 500 hours | After lapse of 1000 hours | After lapse of 2000 hours |
| --- | --- | --- | --- | --- |
| Ex. 35 | Bonding by Ag fusion | 98% | 98% | 97% |
| Comp. Ex. 7 | Bonding with insulative epoxy resin | 95% | 87% | 73% |
| Comp. Ex. 8 | Bonding with epoxy resin containing flake-form silver filler | 93% | 82% | 64% |

Table 5 shows that in the case of the bonding obtained in Example 35, the output only slightly decreased even after a lapse of 2000 hours. On the other hand, it is shown that in the cases of the bonding obtained in Comparative Example 7 and that in Comparative Example 8, the outputs significantly decreased after a lapse of 2000 hours.

Example 36

To silver particles (produced by Fukuda Metal Foil & Powder Co., Ltd., product name: "AgC-239", 2.5 g), silver oxide having an average particle diameter of 0.5 μm to 1.0 μm (principal component: AgO) was added at a ratio by weight of 10 wt %, and tripropylene glycol monomethyl ether was added thereto so that a ratio by weight of the same to a solid portion was 85:15, and these were mixed at 25° C., whereby a first conductive material composition was prepared. At a position of a lead frame where a light-emitting element was mounted, which was obtained by insert molding of a resin portion that would become a reflector, the conductive material composition was applied by stamping. It should be noted that a surface at the position of the lead frame where a light-emitting element was mounted was coated further with silver (thickness: 2 μm) by vapor deposition. On the conductive material composition thus coated with silver, a light-emitting element having a size of 300 μm square was disposed. The lead frame on which the light-emitting element was disposed was heated at 180° C. for two hours in non-oxidizing atmosphere, taken out of the atmosphere, and cooled. The bonding between the light-emitting element and the substrate provided a sufficient strength. The bonded portion at which the light-emitting element and the substrate were bonded was checked by visual observation, and the fusion of particles in the bonding material was observed. Further, it was noted that neither degradation nor discoloration occurred to the lead frame resin portion since the heating was performed in non-oxidizing atmosphere. As to the substrate on which the light-emitting element was bonded, a die-shear strength was measured at room temperature, and was determined to be about 0.3 kgf.

On the light-emitting element of the substrate, another aluminum oxide substrate for a light-emitting device was mounted, and was heated further at 250° C. for two hours. Here, it was noted that the bonded portions of silver between the light-emitting element and the substrate had no discoloration. As to this bonding between the light-emitting element and the substrate, a die-shear strength was measured at room temperature, and was determined to be about 0.3 kgf.

Next, electrodes of the light-emitting element and electrodes of the substrate were connected with gold wiring, and were sealed with a silicone resin. In this state, power-on tests (test conditions: 25° C., 50 mA) were carried out after a lapse of 500 hours, after a lapse of 1000 hours, and after a lapse of 2000 hours. The output results with respect to the initial outputs are shown in Table 6. It should be noted that after a lapse of 2000 hours, no discoloration occurred at the bonded portions of silver between the light-emitting element and the substrate.

Comparative Example 9

An experiment was carried out in the same manner as that in Example 36 except that an epoxy resin (curing conditions: 180° C., 2 hours) was used in place of the first conductive material composition. As to a substrate on which a light-emitting element was bonded, a die-shear strength was measured at room temperature, and was determined to be about 0.4 kgf.

On the light-emitting element of the substrate, another aluminum oxide substrate for a light-emitting device was mounted, and was heated further at 250° C. for two hours. Here, it was noted that the bonded portions of silver between the light-emitting element and the substrate had discoloration into blackish-brownish color. As to this bonding between the light-emitting element and the substrate, a die-shear strength was measured at room temperature, and was determined to be about 0.1 kgf.

Next, electrodes of the light-emitting element and electrodes of the substrate were connected with gold wiring, and were sealed with a silicone resin. In this state, power-on tests (test conditions: 25° C., 50 mA) were carried out after a lapse of 500 hours, after a lapse of 1000 hours, and after a lapse of 2000 hours. The output results with respect to the initial outputs are shown in Table 6. It should be noted that after a lapse of 2000 hours, discoloration to blackish-brownish color occurred at the bonded portions of silver between the light-emitting element and the substrate.

Comparative Example 10

An experiment was carried out in the same manner as that in Example 36 except that an Ag paste (curing conditions: 200° C., 1.5 hours) containing 80 wt % of a silver filler and 20 wt % of an epoxy resin was used in place of the first conductive material composition. As to a substrate on which a light-emitting element was bonded, a die-shear strength was measured at room temperature, and was determined to be about 0.3 kgf.

On the light-emitting element of the substrate, another aluminum oxide substrate for a light-emitting device was mounted, and was heated further at 250° C. for two hours. Here, it was noted that the bonded portions of silver between the light-emitting element and the substrate had discoloration into blackish-brownish color. As to this bonding between the light-emitting element and the substrate, a die-shear strength was measured at room temperature, and was determined to be about 0.1 kgf.

Next, electrodes of the light-emitting element and electrodes of the substrate were connected with gold wiring, and were sealed with a silicone resin. In this state, power-on tests (test conditions: 25° C., 50 mA) were carried out after a lapse of 500 hours, after a lapse of 1000 hours, and after a lapse of 2000 hours. The output results with respect to the initial outputs are shown in Table 6. It should be noted after a lapse of 2000 hours, discoloration to blackish-brownish color occurred at the bonded portions of silver between the light-emitting element and the substrate.

TABLE 6

| | Bonding | After lapse of 500 hours | After lapse of 1000 hours | After lapse of 2000 hours |
|---|---|---|---|---|
| Ex. 36 | Bonding by Ag fusion | 96% | 95% | 95% |
| Comp. Ex. 9 | Bonding with insulative epoxy resin | 90% | 83% | 70% |
| Comp. Ex. 10 | Bonding with epoxy resin containing flake-form silver filler | 88% | 79% | 65% |

As shown in Table 6, it is noted that in the case of the bonding obtained in Example 36, the output only slightly decreased even after a lapse of 2000 hours. On the other hand, it was noted that in the cases of the bonding obtained in Comparative Example 9 and that in Comparative Example 10, the outputs significantly decreased after a lapse of 2000 hours.

INDUSTRIAL APPLICABILITY

The method for producing a conductive material according to present invention can be used for the purpose of producing heat-resistant power wiring, component electrodes, die attaches, microbumps, flat panels, solar wiring, and the like, the purpose of wafer bonding, and the purpose of producing electronic components produced with use of these in combination. The method for producing a conductive material according to the present invention also can be used for, for example, producing a light-emitting device in which a light-emitting element such as LED or LD is used.

The invention claimed is:

1. A method for producing an electronic device comprising the steps of
applying a conductive material over a wiring board or a lead frame, the conductive material containing particles of silver having a median diameter of 0.1 µm to 15 µm and particles of a metal oxide of 30 wt % or less having a median diameter of 0.1 µm to 15 µm dispersed in an organic solvent;
placing at least one of a light-emitting element and an electronic component on the conductive material, so as to obtain an electronic device precursor; and
heating the electronic device precursor at 150° C. to 320° C. in an oxidizing atmosphere of oxygen or ozone, or ambient atmosphere, so that the organic solvent is removed from the conductive material and so that the particles of silver and the particles of the metal oxide are directly exposed to the oxidizing atmosphere, directly contact each other and are sintered to each other.

2. The method for producing an electronic device according to claim 1, wherein the organic solvent is completely vaporized during the heating step.

3. The method for producing an electronic device according to claim 1, wherein the sintering of the particles of silver and metal oxide results in a product which has a re-melting temperature that is about 962° C.

4. The method for producing an electronic device according to claim 1, wherein the conductive material after sintering has a voidage of 5 vol % to 35 vol %.

5. The method for producing an electronic device according to claim 1, wherein the conductive material after sintering has an electric resistance of $5.0\times10^{-5}$ Ω·cm or less.

6. The method for producing an electronic device according to claim 1, wherein the conductive material after sintering is used as a material for electric wiring, component electrodes, die attaches, or microbumps.

7. The method for producing an electronic device according to claim 1, wherein the particles of silver contained in the conductive material before applying over the wiring board or the lead have a flat shape.

8. The method for producing an electronic device according to claim 1, wherein the particles of silver contained in the conductive material before applying over the wiring board or the lead have a specific surface of 0.6 m²/g to 2.5 m²/g, the specific surface being measured by a BET method.

9. A method for producing an electronic device comprising the steps of
applying a conductive material over a wiring board or a lead frame, the conductive material containing particles of silver having a median diameter of 0.1 μm to 15 μm dispersed in an organic solvent;
placing at least one of a light-emitting element and an electronic component on the conductive material, so as to obtain an electronic device precursor; and
heating the electronic device precursor at 150° C. to 320° C. in an oxidizing atmosphere of oxygen or ozone, or ambient atmosphere, so that the organic solvent is removed from the conductive material and so that the particles of silver are directly exposed to the oxidizing atmosphere, directly contact each other and are sintered to each other, and
wherein the conductive material after sintering has a voidage of 5 vol % to 35 vol %.

10. The method for producing an electronic device according to claim 9, wherein the organic solvent is completely vaporized during the heating step.

11. The method for producing an electronic device according to claim 9, wherein the sintering of the particles of silver results in a product which has a re-melting temperature that is about 962° C.

12. The method for producing an electronic device according to claim 9, wherein the conductive material after sintering has an electric resistance of $5.0\times10^{-5}$ Ω·cm or less.

13. The method for producing an electronic device according to claim 9, wherein the conductive material after sintering is used as a material for electric wiring, component electrodes, die attaches, or microbumps.

14. The method for producing an electronic device according to claim 9, wherein the particles of silver contained in the conductive material before applying over the wiring board or the lead have a flat shape.

15. The method for producing an electronic device according to claim 9, wherein the particles of silver contained in the conductive material before applying over the wiring board or the lead have a specific surface of 0.6 m²/g to 2.5 m²/g, the specific surface being measured by a BET method.

* * * * *